(12) United States Patent
Matsumi

(10) Patent No.: US 8,624,233 B2
(45) Date of Patent: Jan. 7, 2014

(54) ORGANIC ELECTROLUMINESCENCE DISPLAY DEVICE AND ELECTRONIC APPARATUS

(75) Inventor: Tatsuya Matsumi, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 13/411,125

(22) Filed: Mar. 2, 2012

(65) Prior Publication Data

US 2012/0228590 A1    Sep. 13, 2012

(30) Foreign Application Priority Data

Mar. 11, 2011    (JP) .................................. 2011-053989

(51) Int. Cl.
    *H01L 29/08*    (2006.01)
(52) U.S. Cl.
    USPC .............................................. 257/40; 438/99
(58) Field of Classification Search
    USPC .......................................................... 257/40
    See application file for complete search history.

(56) References Cited

U.S. PATENT DOCUMENTS

| 2006/0273314 A1* | 12/2006 | Lee ................................. 257/59 |
| 2009/0102369 A1* | 4/2009 | Nakanishi et al. ............ 313/504 |
| 2010/0200875 A1* | 8/2010 | Takei ............................. 257/91 |
| 2011/0227100 A1* | 9/2011 | Kurihara et al. ............... 257/88 |

FOREIGN PATENT DOCUMENTS

| JP | 2003-249375 A | 9/2003 |
| JP | 2005-326799 A | 11/2005 |

* cited by examiner

*Primary Examiner* — Ha Tran T Nguyen
*Assistant Examiner* — Paul Noel
(74) *Attorney, Agent, or Firm* — Wolf, Greenfield & Sacks, P.C.

(57) ABSTRACT

An organic electroluminescence display device includes a pixel isolating film that is provided over a substrate and has a plurality of apertures, and a plurality of pixels provided corresponding to the plurality of apertures. Each of the plurality of pixels has a first electrode, a functional layer including at least an organic light emitting layer, and a second electrode sequentially from the side of the substrate, and part or whole of the first electrode is separate from an edge part of the aperture on the side of the substrate.

11 Claims, 16 Drawing Sheets

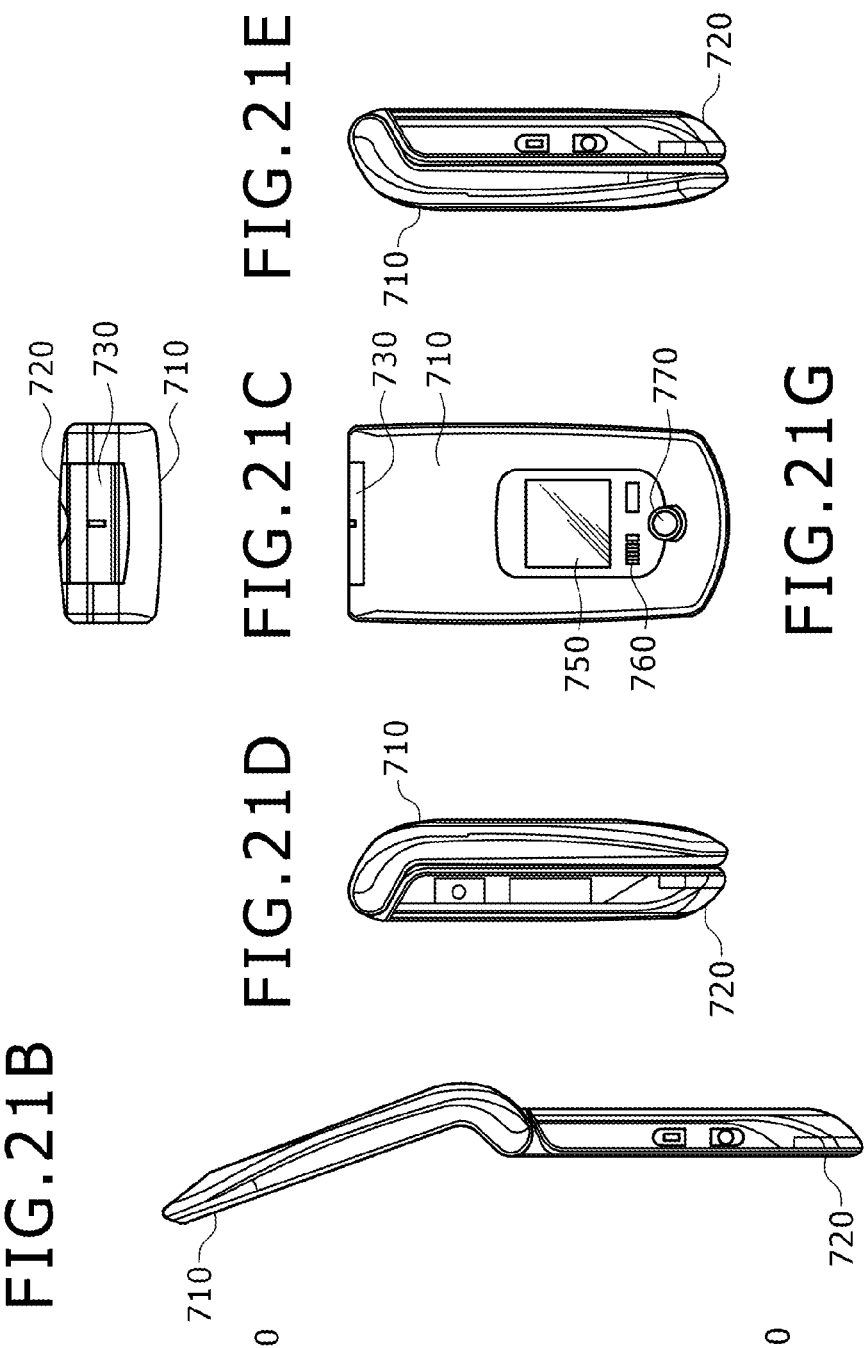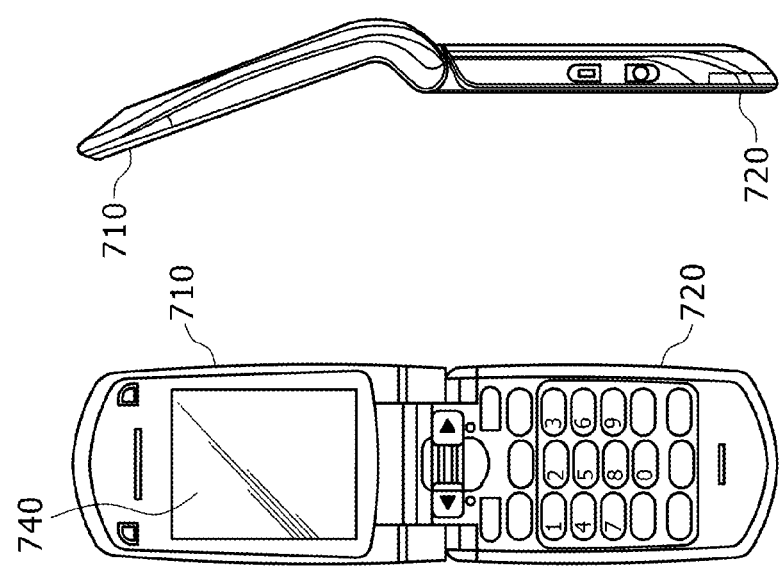

ORGANIC ELECTROLUMINESCENCE DISPLAY DEVICE AND ELECTRONIC APPARATUS

BACKGROUND

The present disclosure relates to an organic electroluminescence (EL) display device that performs image displaying by utilizing an organic electroluminescence phenomenon and electronic apparatus including such an organic EL display device.

As development of the information communication industry is accelerated, display elements having higher performance are required. Among the display elements, the organic EL element, which is attracting attention as a next-generation display element, has not only advantages of having a wide viewing angle and being excellent in the contrast as a self-luminous display element but also an advantage of having a short response time.

The materials of the functional layers, such as a light emitting layer, to form the organic EL element are classified broadly into low-molecular materials and polymer materials. As the film deposition methods of these materials, for the low-molecular material, a dry method such as a vacuum evaporation method is used. For the polymer material, a discharge printing method such as spin coating, inkjet, and nozzle-jet or a plate printing method such as flexo printing, screen printing, gravure printing, and reverse printing is used.

Among these methods, the dry method such as a vacuum evaporation method is free from the need to dissolve the functional layer material in a solvent and therefore has e.g. an advantage that a step of removing the solvent is unnecessary. However, it is difficult to apply the material onto the respective different areas separately by using a metal mask. Therefore, the dry method is unsuitable for size increase and mass production of the panel particularly in terms of the facility manufacturing cost. So, the printing system, which is capable of addressing size increase and mass production of the panel comparatively easily, is attracting attention.

In a film deposition method based on the printing system, specifically a lower electrode is formed for each pixel over a circuit board including a thin film transistor (TFT) and so forth and thereafter a pixel isolating film (so-called bank) having apertures opposed to the lower electrodes is formed. Then, lyophobic treatment is performed for the deposited pixel isolating film and thereafter a solution containing the above-described functional layer material is applied and dried. Thereby, a functional layer can be formed in each aperture. However, if the functional layer is formed through the step of applying and drying a solution, the functional layer is thinned in the drying near the interface between the pixel isolating film and the lower electrode because the wettability is different between them. This causes the occurrence of electrical short-circuiting, which leads to a problem of the deterioration of the displayed-image quality.

So, there has been proposed a method in which an inorganic material layer is additionally provided between the above-described pixel isolating film and lower electrode (two-layer structure is employed as the bank structure) to thereby prevent the thinned part generated in the drying step from getting contact with the lower electrode (refer to e.g. Japanese Patent Laid-Open No. 2003-249375 and Japanese Patent Laid-Open No. 2005-326799 (hereinafter referred to as Patent Documents 1 and 2)).

SUMMARY

However, in this method of Patent Documents 1 and 2, the inorganic material layer needs to be additionally provided (bank needs to be formed by a two-stage step). Thus, there is a problem that the number of steps and the number of parts are increased and realization of cost reduction is difficult.

There is a need for a technique to provide an organic EL display device capable of suppressing the deterioration of the displayed-image quality while achieving cost reduction.

According to an embodiment of the present disclosure, there is provided an organic EL display device including a pixel isolating film configured to be provided over a substrate and have a plurality of apertures, and a plurality of pixels configured to be provided corresponding to the plurality of apertures. Each of the plurality of pixels has a first electrode, a functional layer including at least an organic light emitting layer, and a second electrode sequentially from the side of the substrate, and part or whole of the first electrode is separate from an edge part of the aperture on the side of the substrate.

According to another embodiment of the present disclosure, there is provided electronic apparatus including the organic EL display device according to the above-described embodiment of the present disclosure.

In the organic EL display device and the electronic apparatus according to the embodiments of the present disclosure, in the pixels that are provided corresponding to the respective apertures of the pixel isolating film and each have the first electrode, the functional layer including the organic light emitting layer, and the second electrode in that order from the substrate side, part or whole of the first electrode is separate from the edge part of the aperture. Due to this feature, the thinned part of the functional layer generated in film deposition is readily formed at a position distant from the first electrode (local thickness change of the functional layer occurs less readily in the substantial light emitting area corresponding to the first electrode). Thus, the occurrence of electrical short-circuiting between the first electrode and the second electrode is suppressed.

According to the organic EL display device and the electronic apparatus of the embodiments of the present invention, the pixels each having the first electrode, the functional layer including the organic light emitting layer, and the second electrode in that order from the substrate side are provided corresponding to the respective apertures in the pixel isolating film, and part or whole of the first electrode is separate from the edge part of the aperture. Thus, thickness unevenness of the functional layer generated in film deposition can be prevented from being formed opposed to the light emitting area. This can suppress the occurrence of electrical short-circuiting in the light emitting area without additionally forming another layer for short-circuiting prevention between the pixel isolating film and the first electrode. Thus, the deterioration of the displayed-image quality can be suppressed with achievement of cost reduction.

BRIEF DESCRIPTION OF THE DRAWINGS

FIG. 21A is a front view of the opened state of application example 5, FIG. 21B is a side view of the opened state, FIG. 21C is a front view of the closed state, FIG. 21D is a left side view, FIG. 21E is a right side view, FIG. 21F is a top view, and FIG. 21G is a bottom view.

DETAILED DESCRIPTION OF THE PREFERRED EMBODIMENT

An embodiment of the present disclosure will be described in detail below with reference to the drawings. The order of the description is as follows.

1. Embodiment (example in which lower electrode is disposed separately from edge part of aperture of bank layer (lyophobic) on interlayer insulating film (lyophilic))
2. Modification Example 1 (example in which separation distance differs depending on pixel position)
3. Modification Example 2 (example in which organic planarizing film is formed over substrate)
4. Application Examples (examples of application to electronic apparatus)

<Embodiment>
[Configuration of Organic EL Display Device]

Figure 1:
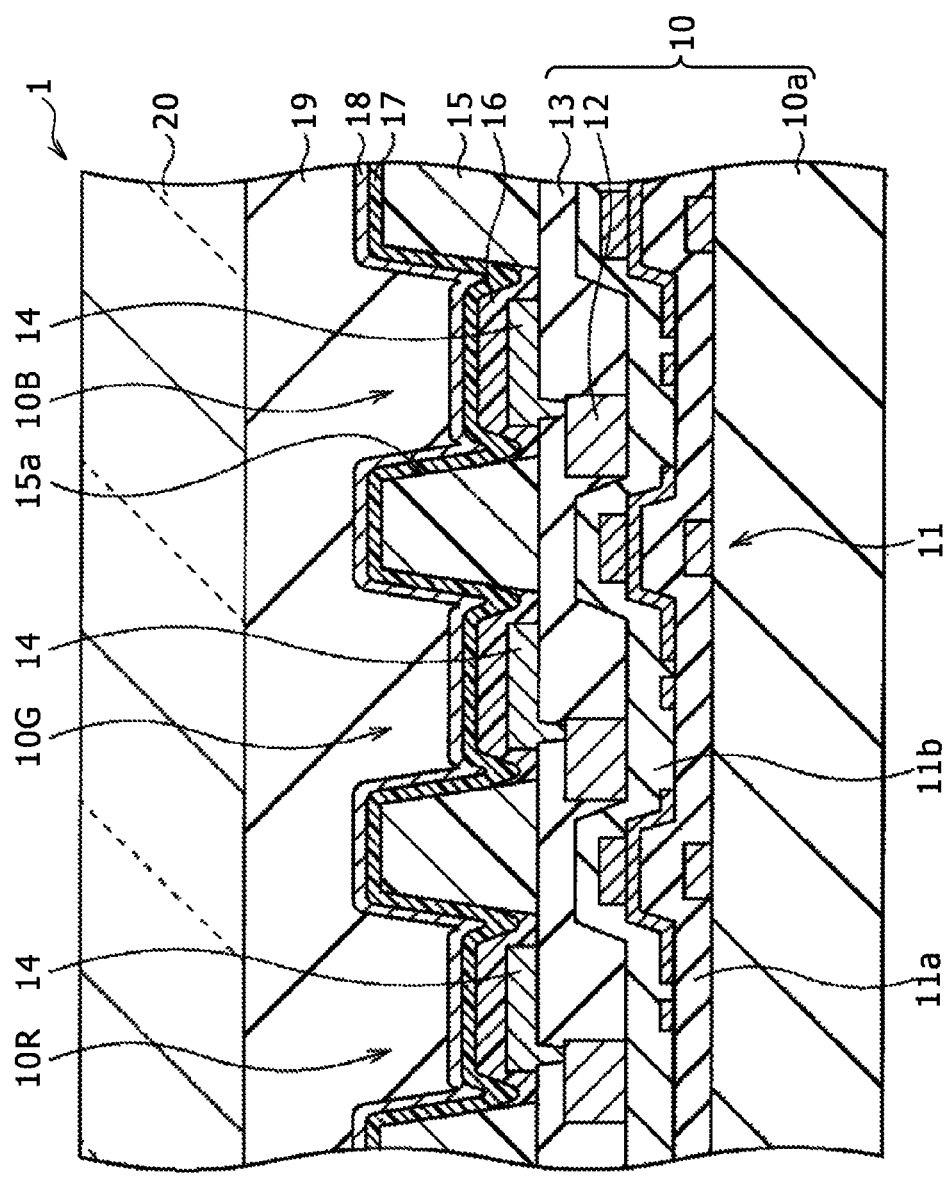
FIG. 1 is a diagram showing the sectional configuration of an organic EL display device according to one embodiment of the present disclosure.

FIG. 1 shows the sectional configuration of an organic EL display device according to one embodiment of the present disclosure (organic EL display device 1). The organic EL display device 1 is used as e.g. an organic EL television device capable of full-color displaying. In this organic EL display device 1, for example, over a drive board 10, organic EL elements 10R to emit red light, organic EL elements 10G to emit green light, and organic EL elements 10B to emit blue light are arranged in a matrix as plural pixels to configure a display area (display area 110 to be described later). These organic EL elements 10R, 10G, and 10B are each provided in an area (aperture 15a) defined by a bank layer 15 as a pixel isolating film over the drive board 10.

(Drive Board 10)

The drive board 10 is obtained by disposing a drive circuit (pixel drive circuit 140 to be described later and so forth) including TFTs 11, a wiring layer 12, and so forth over a substrate 10a. For example, the TFT 11 is obtained by stacking electrode wiring layers of the gate, source, drain, and so forth, a semiconductor layer to form the channel, and interlayer insulating films 11a and 11b. The wiring layer 12 is formed on the interlayer insulating film 11b for example. An interlayer insulating film 13 (inorganic insulating film) is so provided as to cover these TFTs 11 and wiring layer 12. In the present embodiment, this interlayer insulating film 13 is the surface on which the organic EL elements 10R, 10G, and 10B and the bank layer 15 are formed.

The substrate 10a is formed of e.g. quartz, glass, metal foil, silicon, or plastic. TFT 11 is equivalent to e.g. a drive transistor Tr1 and a write transistor Tr2 in the pixel drive circuit 140 to be described later. Its configuration may be e.g. an inverted-staggered structure (so-called bottom gate type) or a staggered structure (top gate type). The interlayer insulating films 11a and 11b are a single-layer film, a multilayer film, or a mixed composition film containing at least one kind of silicon oxide ($SiO_2$), silicon nitride (SiN), titanium oxide ($TiO_2$), and titanium nitride (TiN). The wiring layer 12 is composed of an electrically-conductive metal and electrically connected to e.g. the drain of the TFT 11. It is desirable for this wiring layer 12 to have a metal whose contact resistance to the lower electrode 14 is low or such a metal oxide at the connection surface to the lower electrode 14. The wiring layer 12 is composed of e.g. molybdenum (Mo) or titanium (Ti) or may be composed of aluminum (Al) or copper (Cu) covered by molybdenum or titanium.

The interlayer insulating film 13 is formed of e.g. a single-layer film or a multilayer film containing at least one kind of silicon oxide, silicon nitride, titanium oxide, and titanium nitride. Alternatively, it may contain silicon oxynitride ($SiN_xO_y$) or aluminum oxide ($Al_xO_y$) and may contain a metal oxide that does not have electrical conductivity. In this interlayer insulating film 13, contact holes that penetrate to the surface of the wiring layer 12 are formed. The lower electrode 14 is so provided as to fill this contact hole. Thereby, the lower electrode 14 is electrically connected to the wiring layer 12 and a predetermined potential is supplied to each of the organic EL elements 10R, 10G, and 10B via the lower electrode 14.

In the present embodiment, the wettability of this interlayer insulating film 13 to the organic solvent used in deposition of the functional layer 16 is higher than that of the bank layer 15 to be described later, and the interlayer insulating film 13 functions as a lyophilic film. As described in detail later, the lower electrode 14 and the bank layer 15 having lyophobicity are disposed on the surface of such an interlayer insulating film 13.

Figure 2:
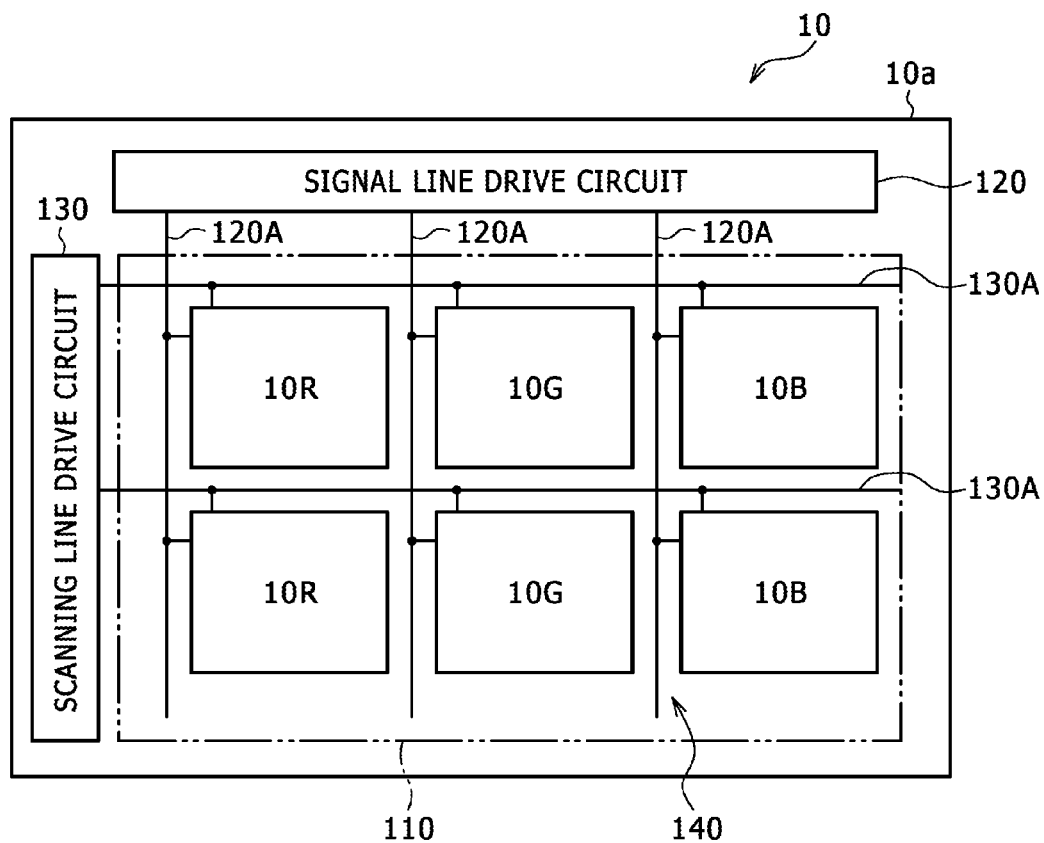
FIG. 2 is a diagram showing one example of a drive circuit over a substrate shown in FIG. 1.
Figure 3:
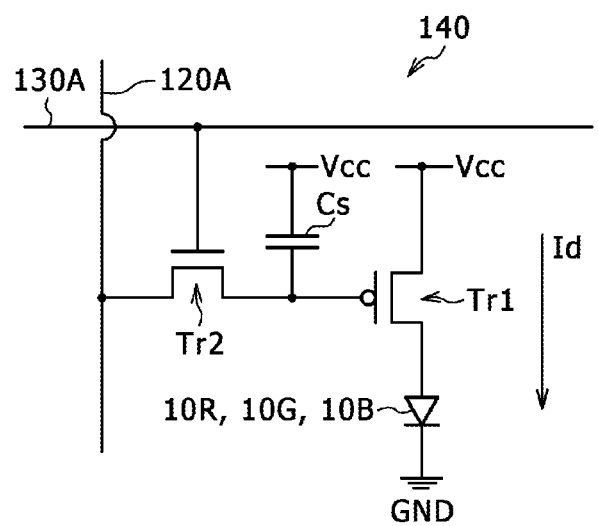
FIG. 3 is a diagram showing one example of a pixel drive circuit shown in FIG. 2.

FIG. 2 shows one example of the drive circuit of the drive board 10. In the drive board 10, the pixel drive circuit 140 is provided in the display area 110 and a signal line drive circuit 120 and a scanning line drive circuit 130 as drivers for video displaying are provided around the display area 110. FIG. 3 shows one example of the pixel drive circuit 140. The pixel drive circuit 140 is an active drive circuit formed under the lower electrode 14 to be described later. This pixel drive circuit 140 has the drive transistor Tr1 and the write transistor Tr2 (equivalent to the above-described TFT 11) and a capacitor (hold capacitance) Cs between these transistors Tr1 and Tr2. Furthermore, the pixel drive circuit 140 has the organic EL element 10R (or organic EL element 10G or 10B) connected in series to the drive transistor Tr1 between a first power supply line (Vcc) and a second power supply line (GND).

In the pixel drive circuit 140, plural signal lines 120A are disposed along the column direction and plural scanning lines 130A are disposed along the row direction. The intersection of the signal line 120A and the scanning line 130A corresponds to one of the organic EL elements 10R, 10G, and 10B. Each signal line 120A is connected to the signal line drive circuit 120 and an image signal is supplied from this signal line drive circuit 120 to the source electrode of the write transistor Tr2 via the signal line 120A. Each scanning line 130A is connected to the scanning line drive circuit 130 and a scanning signal is sequentially supplied from this scanning line drive circuit 130 to the gate electrode of the write transistor Tr2 via the scanning line 130A.

(Organic EL Element 10R, 10G, 10B)

Each of the organic EL elements 10R, 10G, and 10B is obtained by stacking, over the drive board 10, the lower electrode 14 as the anode, the functional layer 16 including a light emitting layer 16c to be described later, and an upper electrode 18 as the cathode in that order. These organic EL elements 10R, 10G, and 10B are covered by a protective layer 19 and a sealing substrate 20 composed of e.g. glass is bonded onto this protective layer 19 by an adhesion layer (not shown) formed of e.g. a heat-curable resin or an ultraviolet-curable resin. Thereby, the whole display area is sealed.

The lower electrode 14 is provided for each of the pixels of the organic EL elements 10R, 10G, and 10B. The thickness of the lower electrode 14 is e.g. 10 nm to 1000 nm. In the case of the bottom emission type, the lower electrode 14 is formed of a transparent electrically-conductive film, specifically e.g. a single-layer film composed of any of an oxide of indium and tin (ITO), indium zinc oxide (InZnO), and an alloy of zinc oxide (ZnO) and aluminum (Al) or a multilayer film composed of two or more kinds of these materials. In the case of the top emission type, the lower electrode 14 is configured by using an electrically-conductive material that is excellent in the light reflectivity (reflectance of 40% or higher is desirable). This lower electrode 14 is composed of e.g. a single material or an alloy of metal elements such as chromium (Cr), gold (Au), platinum (Pt), nickel (Ni), copper (Cu), tungsten (W), and silver (Ag). Alternatively, the lower electrode 14 may have a multilayer structure formed of a metal film composed of a single material or an alloy of these metal elements and a transparent electrically-conductive film of e.g. ITO, InZnO, or an alloy of zinc oxide (ZnO) and aluminum (Al). If the lower electrode 14 functions as the anode, it is desirable that the lower electrode 14 is composed of a material having high hole injection ability. However, even with a material that does not have such a characteristic (e.g. aluminum alloy), the film made by this material can be used as the lower electrode 14 by additionally providing a proper hole injection layer.

Figure 4:
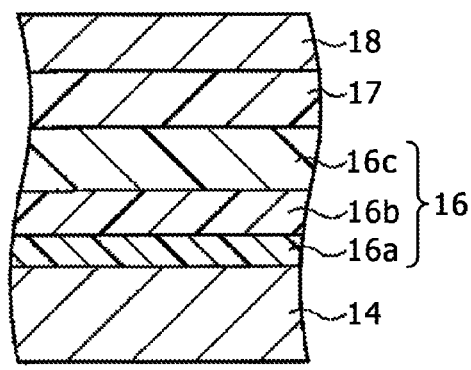
FIG. 4 is a diagram showing the detailed sectional configuration of an organic EL element (pixel) shown in FIG. 1.

FIG. 4 shows one example of the sectional structure of the organic EL element (pixel). As shown in the diagram, if the lower electrode 14 functions as the anode, the functional layer 16 is obtained by stacking a hole injection layer 16a, a hole transport layer 16b, and the light emitting layer 16c in that order from the side of the lower electrode 14 for example. As the light emitting layer 16c, a light emitting layer of the corresponding color in each of the organic EL elements 10R, 10G, and 10B (red light emitting layer, green light emitting layer, blue light emitting layer) is provided. On the other hand, the layers in the functional layer 16 except for the light emitting layer 16c, i.e. the hole injection layer 16a and the hole transport layer 16b, are layers common to the respective pixels of the organic EL elements 10R, 10G, and 10B. Between the functional layer 16 (light emitting layer 16c) and the upper electrode 18, an electron transport layer 17 is provided in common to the respective elements. The sectional structure of the organic EL elements 10R, 10G, and 10B is not limited thereto. Other layers (e.g. electron injection layer) may be provided and part of the light emitting layer may be a common layer. For example, the following structure may be employed. Specifically, in the organic EL elements 10R and 10G, the red and green light emitting layers corresponding to these elements are provided. In addition, the blue light emitting layer is provided as a layer common to the organic EL elements 10R, 10G, and 10B.

The hole injection layer 16a is a buffer layer for enhancing the efficiency of hole injection to the light emitting layer 16c and preventing leakage. This hole injection layer 16a is composed of a polymer material and deposited by a printing method. The weight-average molecular weight (Mw) of the polymer material is typically in the range of 10000 to 300000, and preferably about 5000 to 200000 particularly. Alternatively, an oligomer whose weight-average molecular weight (Mw) is about 2000 to 10000 may be used. However, if the weight-average molecular weight (Mw) is smaller than 5000, possibly the hole injection layer is dissolved in forming the hole transport layer and the subsequent layers. If the weight-average molecular weight (Mw) surpasses 300000, the material is turned into a gel and the film deposition becomes difficult. The weight-average molecular weight (Mw) is the value obtained by employing tetrahydrofuran as the solvent and obtaining the weight-average molecular weight in terms of polystyrene by gel permeation chromatography (GPC). The material of such a hole injection layer 16a is appropriately selected depending on the relationship with the materials of the electrode and adjacent layer. Examples of the material include polyaniline, oligoaniline, polythiophene, polypyrrole, polyphenylenevinylene, polythienylenevinylene, polyquinoline, polyquinoxaline, and derivatives of them, electrically-conductive polymers such as a polymer including an aromatic amine structure in the main chain or the side chain, metal phthalocyanine (such as copper phthalocyanine), and carbon. The thickness of the hole injection layer 16a is e.g. 5 nm to 100 nm.

The hole transport layer 16b is to enhance the efficiency of hole transport to the light emitting layer 16c. This hole transport layer 16b is also composed of a polymer material and deposited by a printing method similarly to the above-described hole injection layer 16a. It is preferable that its weight-average molecular weight (Mw) be 50000 to 300000 and it is particularly preferable that it be 100000 to 200000. If the weight-average molecular weight (Mw) is smaller than 50000, a low-molecular component in the polymer material drops off in forming the light emitting layer 16c, and possibly this causes the lowering of the initial performance of the organic EL element and the deterioration of the element. If the weight-average molecular weight (Mw) surpasses 300000, the material is turned into a gel and the film deposition becomes difficult. As the polymer material to configure such a hole transport layer 16b, a light emitting material that is soluble in an organic solvent to be described later is used. Examples of the material include polyvinylcarbazole, polyfluorene, polyaniline, polysilane, and derivatives of them, polysiloxane derivatives having aromatic amine in the side chain or the main chain, polythiophene and derivatives thereof, and polypyrrole. The thickness of this hole transport layer 16b is e.g. 10 nm to 200 nm although depending on the whole configuration of the element.

The light emitting layer 16c is to generate light through the occurrence of recombination of electron and hole by application of an electric field. This light emitting layer 16c contains a polymer (light emitting) material and is deposited by a printing method. Examples of the polymer material to configure the light emitting layer 16c include the following substances, shown on each emission color basis. Specifically, regarding the organic EL element 10R to emit red light and the organic EL element 10G to emit green light, examples of the polymer material of the light emitting layer 16c include polyfluorene-based polymer derivatives, (poly) paraphenylenevinylene derivatives, polyphenylene derivatives, polyvinylcarbazole derivatives, polythiophene derivatives, perylene-based dyes, coumarin-based dyes, rhodamine-based dyes, and substances obtained by doping the above-described polymers with an organic EL material. As the doping material, e.g. rubrene, perylene, 9,10-diphenylanthracene, tetraphenylbutadiene, nile red, and coumarin 6 can be used. For the organic EL element 10B to emit blue light, an anthracene derivative can be used as the host material, and e.g. a low-molecular fluorescent material, a phosphorite dye, or a metal complex can be used as the doping material. The thickness of this light emitting layer 16c is e.g. 10 nm to 200 nm although depending on the whole configuration of the element.

In film deposition of these hole injection layer 16a, hole transport layer 16b, and light emitting layer 16c, a solution prepared by dissolving any of the above-described polymer materials in an organic solvent containing e.g. at least one kind of the following substances is used: toluene, xylene, anisole, cyclohexanone, mesitylene (1,3,5-trimethylbenzene), pseudocumene (1,2,4-trimethylbenzene), dihydrobenzofuran, 1,2,3,4-tetramethylbenzene, tetralin, cyclohexylbenzene, 1-methylnaphthalene, p-anisyl alcohol, dimethylnaphthalene, 3-methylbiphenyl, 4-methylbiphenyl, 3-isopropylbiphenyl, and monoisopropylnaphthalene.

The electron transport layer 17 is to enhance the efficiency of electron transport to the light emitting layer 16c. Examples of the material of this electron transport layer 17 include quinoline, perylene, phenanthroline, bisstyryl, pyrazine, triazole, oxazole, fullerene, oxadiazole, fluorenone, and derivatives and metal complexes of them. Specific examples of the material include tris-(8-hydroxyquinoline)aluminum (abbreviation, Alq3), anthracene, naphthalene, phenanthrene, pyrene, perylene, butadiene, coumarin, C60, acridine, stilbene, 1,10-phenanthroline, and derivatives and metal complexes of them.

The upper electrode 18 has a thickness of e.g. 2 nm to 200 nm and is formed of a metal electrically-conductive film. Specifically, a film composed of an elemental metal or an alloy containing at least one kind of aluminum (Al), magnesium (Mg), calcium (Ca), and sodium (Na) can be used. Alternatively, a transparent electrically-conductive film of e.g. ITO may be used. This upper electrode 18 is formed over the functional layer 16 in such a state as to be insulated from the lower electrode 14, and serves as a common electrode of the organic EL elements 10R, 10G, and 10B.

Between the electron transport layer 17 and the upper electrode 18, an electron injection layer (not shown) may be provided. As the electron injection material, e.g. lithium oxide ($Li_2O$), which is an oxide of lithium (Li), cesium carbonate ($Cs_2CO_3$), which is a composite oxide of cesium (Cs), and a mixture of these oxide and composite oxide can be used. Alternatively, alkaline earth metals such as calcium (Ca) and barium (Ba), alkali metals such as lithium and cesium, and metals having a low work function, such as indium (In) and magnesium, may be used.

(Bank Layer 15)

The bank layer 15 has the plural apertures 15a and is to ensure insulation between the lower electrode 14 and the upper electrode 18 in the above-described organic EL elements 10R, 10G, and 10B and define (isolate) the respective pixel areas. Furthermore, the bank layer 15 functions also as a partition for applying the functional layer 16 into the respective different areas separately without the effect on adjacent pixels in print-forming the functional layer 16 in a manufacturing step to be described later. Such a bank layer 15 is kept in such a state that its wettability to the organic solvent used in the deposition of the functional layer 16 is low (lyophobic state). Specifically, the bank layer 15 is formed of any of a polyimide resin, an acrylic resin, a novolac resin, etc. and predetermined lyophobic treatment (e.g. plasma treatment by use of a fluorine gas) is performed for its surface. Alternatively, the bank layer 15 may be configured by a lyophobic resin containing fluorine. The thickness of this bank layer 15 is e.g. 300 nm to 3000 nm.

In the apertures 15a of this bank layer 15, the organic EL elements 10R, 10G, and 10B are provided as described above. In the present embodiment, the lower electrode 14 is provided at a predetermined position in the aperture 15a and the functional layer 16 is so formed as to cover this lower electrode 14. The detailed configuration of the vicinity of the aperture 15a will be described below.

(Detailed Configuration of Vicinity of Aperture of Bank Layer 15)

Figure 5:
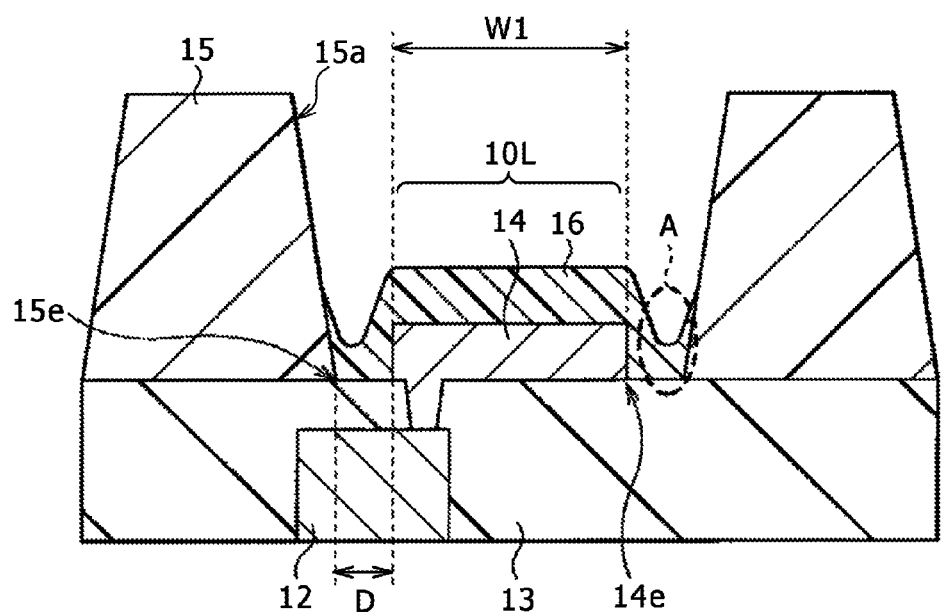
FIG. 5 is an enlarged sectional view of the vicinity of an aperture of a bank layer shown in FIG. 1.
Figure 6:
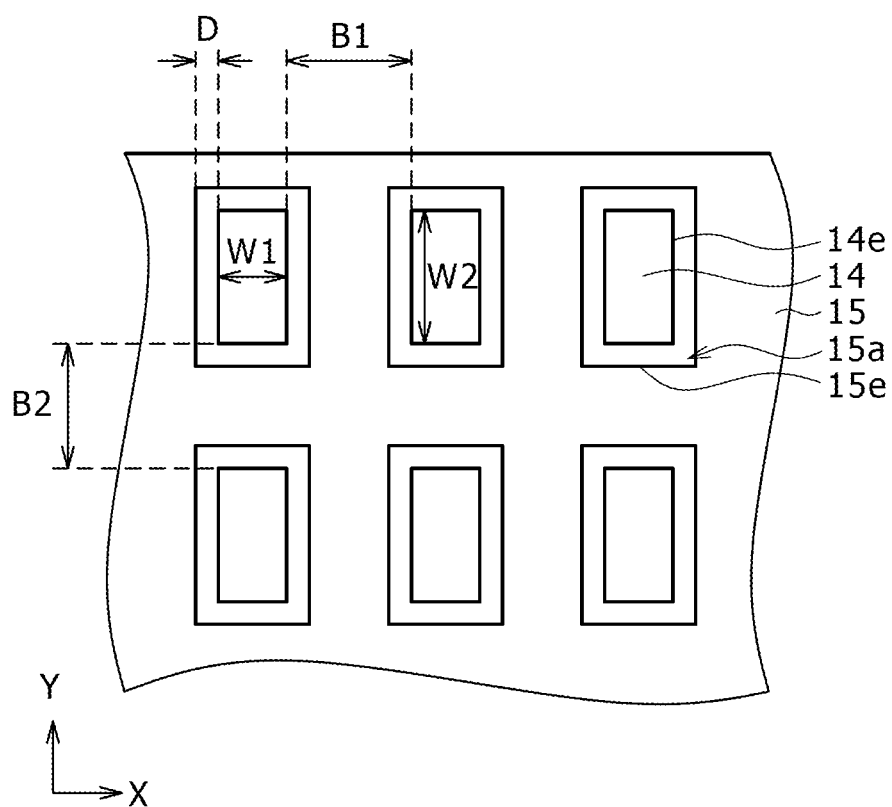
FIG. 6 is a diagram showing one example of the planar configuration of lower electrodes and the bank layer.

FIG. 5 is an enlarged diagram of a sectional structure near the aperture 15a of the bank layer 15. FIG. 6 is a top view of the lower electrodes 14 disposed in the apertures 15a of the bank layer 15. In FIG. 5, the configuration of only the major part is shown. As shown in the diagram, in the present embodiment, each of the lower electrodes 14 of the organic EL elements 10R, 10G, and 10B is disposed separately from an edge part 15e of the aperture 15a. In this configuration, the lower electrode 14 has e.g. a rectangular planar shape and each of end parts 14e corresponding to four sides of this rectangular shape is disposed at an interval from the edge part 15e of the aperture 15a by a distance D (separation distance). That is, in this configuration, part of the surface of the interlayer insulating film 13 provided on the drive board 10 is exposed in the area between the bank layer 15 and the lower electrode 14, and the functional layer 16 is so provided as to cover this exposed area and the lower electrode 14. In other words, the bank layer 15 is provided in contact with not the lower electrode 14 but the surface of the interlayer insulating film 13.

As just described, the functional layer 16 is so provided as to cover the lower electrode 14 and the area between the lower electrode 14 and the bank layer 15. However, this functional layer 16 has thickness unevenness generated in the film deposition process. Specifically, the functional layer 16 is deposited by a printing method and a locally thinned part (thinned part A) is generated in the functional layer 16 in the step of drying the organic solvent (details will be described later). In the present embodiment, such a thinned part A of the functional layer 16 is formed in the area between the edge part 15e of the aperture 15a and the end part 14e of the lower electrode 14 (i.e. area on the exposed interlayer insulating film 13). In other words, the functional layer 16 is formed with a substantially uniform thickness at least in the area opposed to the lower electrode 14. This area opposed to the lower electrode 14 serves as the substantial light emitting area (light emitting area 10L).

It is desirable that the above-described distance D (μm) be equal to or longer than 5 μm specifically, and it is more desirable that the distance D satisfy the following expression (1). It is further more desirable that the distance D satisfy the following expressions (1) and (2). In these expressions, B (μm) is defined as the width between the adjacent lower electrodes 14. Specifically, because two kinds of width B (B1 and B2) exist along the X direction and the Y direction as shown in FIG. 6, it is more desirable that the following expressions (1) and (2) be satisfied regarding both of these widths B1 and B2.

$$5 \leq D \leq (1/2) \times (B-15) \quad (1)$$

$$25 \leq B \quad (2)$$

If the distance D is too short, specifically if it is shorter than 5 μm, the thinned part A is so formed as to overlap with the area directly above the lower electrode 14, i.e. the light emitting area 10L, and evenness of the film thickness in the light emitting area 10L is not obtained. That is, substantially the aperture ratio is lowered. Therefore, it is desirable that the distance D be equal to or longer than 5 μm. On the other hand, if the distance D becomes too long, the area that does not contribute to the light emitting area 10L increases and thus the unnecessary material (organic material that does not contribute to light emission in the functional layer 16) increases. Furthermore, the need to decrease the size of the lower electrode 14 itself often arises and thus the aperture ratio is lowered conversely. Therefore, it is desirable to set the upper limit of the distance D as shown by the above-described expression (1). The upper limit of this expression (1) is conditioned on that B is equal to or larger than 15 μm. This is based on the following reason. Specifically, in the film deposition process of the functional layer 16, the functional layer material (ink) is dropped into the area surrounded by the bank layer 15. At this time, the ink is so dropped as to rise to the top surface of the bank layer 15 (see e.g. FIGS. 7D and 7E to be described later). Therefore, if the interval between the lower electrodes 14 is too short (B is too small), the ink runs out to the adjacent pixel, which causes light emission failure. It is experimentally known that B equal to or larger than 15 μm suppresses such an influence on the adjacent pixel. Therefore, coupled with this point, the upper limit of the above-described expression (1) is set.

In the diagrammatic representation of FIG. 6, the respective distances from four end parts 14e of the lower electrode 14 to the edge part 15e are equal to each other. However, the respective end parts 14e of the lower electrode 14 do not necessarily need to be separate from the edge part 15e by the same distance and the separation distance may differ for each of the end parts 14e corresponding to the respective sides. Furthermore, all end parts 14e do not necessarily need to be separate from the edge part 15e and it is enough that at least part of the lower electrode 14 is disposed separately from the bank layer 15. For example, the following configuration may be employed. Specifically, part of the lower electrode 14, e.g. the end part 14e corresponding to one side among four sides, is in contact with the edge part 15e (or is so formed as to overlap with the bank layer 15), and the end parts 14e corresponding to the other three sides are disposed separately from the edge part 15e.

The protective layer 19 has a thickness of e.g. 2 to 3 μm and may be configured by either an insulating material or an electrically-conductive material. As the insulating material, an inorganic amorphous insulating material is preferable. Examples of such a material include amorphous silicon (a-Si), amorphous silicon carbide (a-SiC), amorphous silicon nitride (a-$Si_{1-x}N_x$), and amorphous carbon (a-C). Such an inorganic amorphous insulating material forms no grain and thus has low water permeability. Therefore, a favorable protective film is obtained.

The sealing substrate 20 is to seal the organic EL elements 10R, 10G, and 10B together with the adhesion layer (not shown). This sealing substrate 20 is composed of a material, such as glass, that is transparent to the respective color light beams generated by the organic EL elements 10R, 10G, and 10B. The sealing substrate 20 may be provided with e.g. a color filter and a light blocking film as a black matrix (neither is shown). This can improve the contrast by extracting the respective color light beams generated by the organic EL elements 10R, 10G, and 10B and absorbing ambient light reflected among the organic EL elements 10R, 10G, and 10B and by wiring and so forth. The color filter has red, green, and blue filters disposed corresponding to the organic EL elements 10R, 10G, and 10B and the filter of each color is composed of a resin in which a pigment is mixed. The light blocking film is formed of e.g. a resin film in which a black colorant is mixed or a thin film filter utilizing the interference of a thin film. The thin film filter is obtained by stacking one or more thin films composed of a metal, a metal nitride, or a metal oxide for example and is to attenuate light by utilizing the interference of the thin film.

[Method for Manufacturing Organic EL Display Device]

The above-described organic EL display device 1 can be manufactured in the following manner for example. FIGS. 7A to 7G show a method for manufacturing the organic EL display device 1 in the step order.

First, the drive board 10 having the interlayer insulating film 13 composed of an inorganic material as described above as its top surface (having the interlayer insulating film 13 covering the TFTs 11 and the wiring layer 12) is prepared. The interlayer insulating film 13 is composed of an inorganic insulating material such as $SiO_2$ as described above and can be deposited by e.g. a chemical vapor deposition (CVD) method. In this drive board 10, contact holes are formed in the areas corresponding to the wiring layer 12 in the interlayer insulating film 13 by using photolithography technique and etching (wet etching or dry etching) technique, and the lower electrodes 14 composed of the above-described material are so deposited as to fill these contact holes.

Figure 7A:
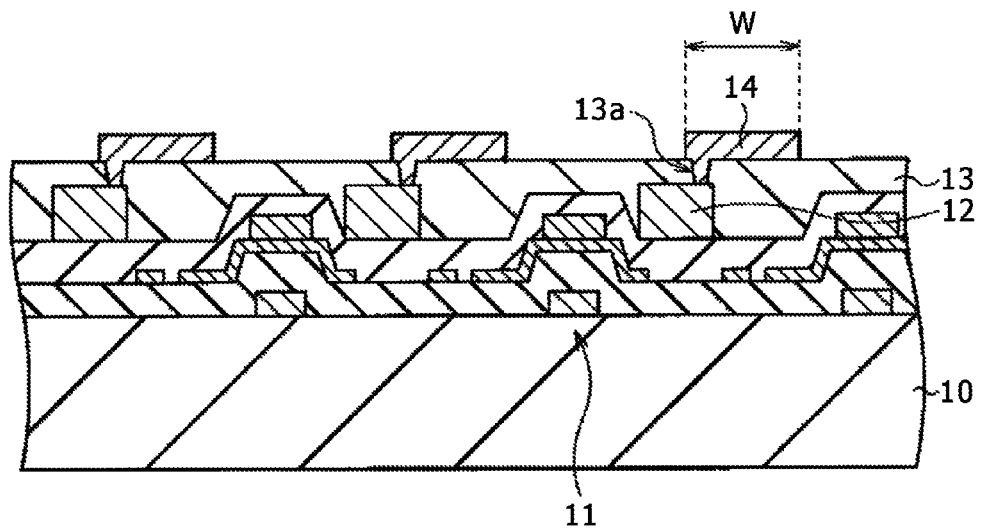
FIGS. 7A to 7G are sectional views for explaining a method for manufacturing the organic EL display device shown in FIG. 1.
Figure 7B:
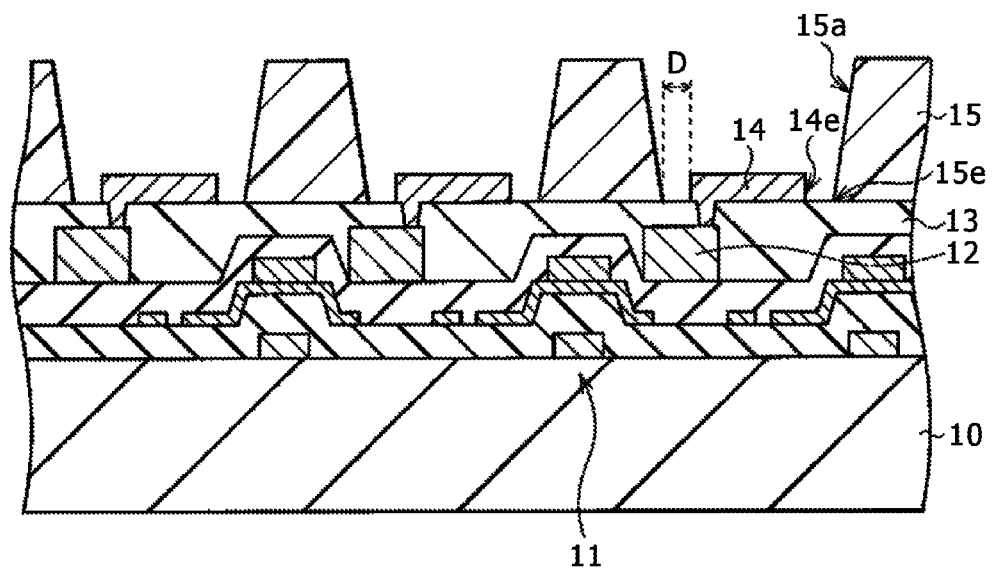

Thereafter, as shown in FIG. 7A, the deposited lower electrodes 14 are patterned into a rectangular shape having predetermined widths W (W1, W2). Subsequently, a resin material to become the bank layer 15 is deposited across the whole surface of the drive board 10 and then the apertures 15a are formed in the areas corresponding to the lower electrodes 14 by e.g. a photolithography method. At this time, as shown in FIG. 7B, the aperture 15a is so formed that its edge part 15e is separate from the end part 14e of the lower electrode 14 by the predetermined distance D. It is preferable to adjust the distance D by changing not the size of the lower electrode 14 but the size of the aperture 15a of the bank layer 15. Specifically, in forming the aperture 15a, a photomask in which apertures are provided corresponding to the forming positions of the predetermined apertures 15a is used. The distance D is set by appropriately setting the shape and size of the apertures in the photomask. Furthermore, it is desirable that such a distance D satisfy the above-described expression (1).

Figure 7C:
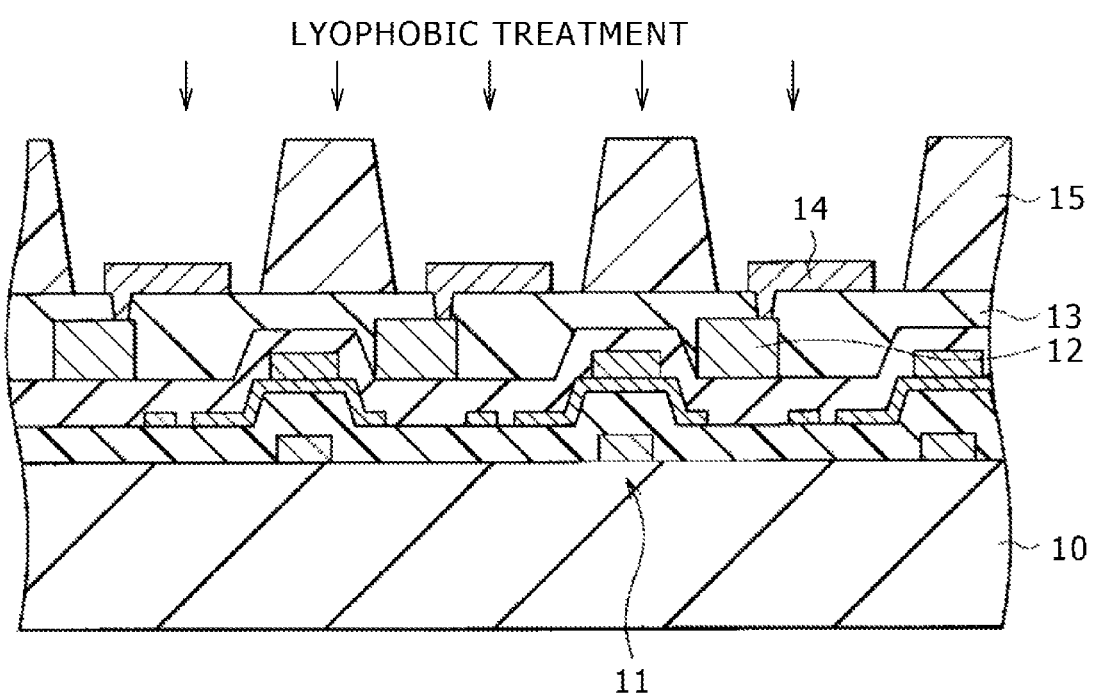

Subsequently, as shown in FIG. 7C, lyophobic treatment is performed for the surface of the formed bank layer 15.

Examples of the lyophobic treatment include parallel-plate plasma treatment by use of a fluorine gas or a mixed gas thereof. In this lyophobic treatment, only the bank layer 15 composed of an organic material is turned to a lyophobic layer whereas the lower electrode 14 and the interlayer insulating film 13, which are composed of an inorganic material, are not turned to lyophobic components and the lyophilicity is kept.

Figure 7D:
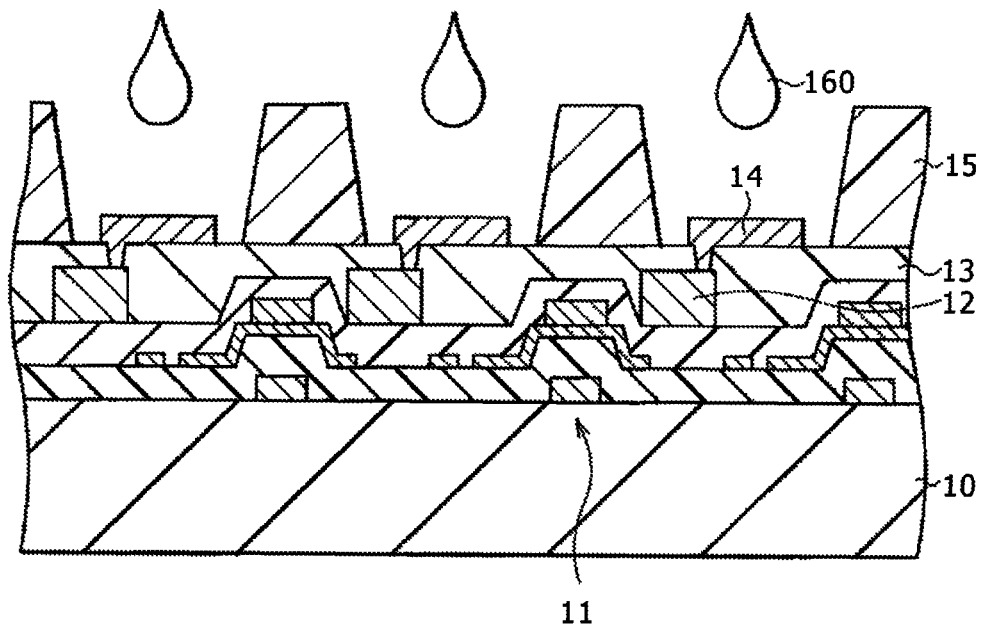
Figure 7E:
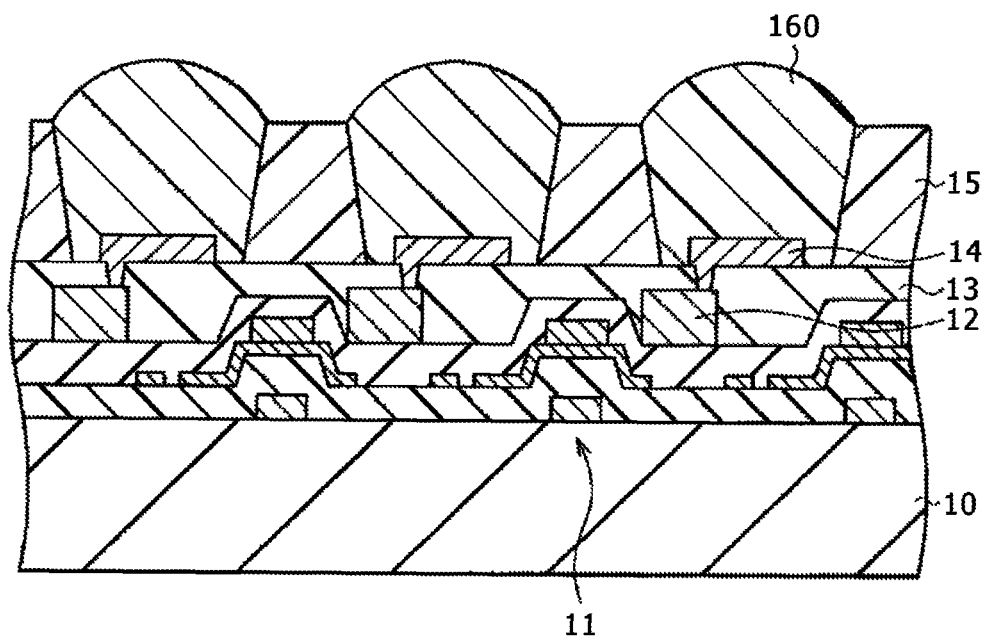

Next, the functional layer 16 composed of the above-described material is formed in the plural apertures 15a of the bank layer 15 by a printing method (wet method). Specifically, as shown in FIG. 7D, first a functional layer material 160 (in this method, solution or dispersion liquid of e.g. polyaniline or polythiophene as a hole injection material) is applied by using a droplet discharge method or the like. Examples of the droplet discharge method include inkjet method, slit coating method, and nozzle coating method. The functional layer material 160 dropped in this manner is aggregated in the apertures 15a of the bank layer 15 due to the difference in the wettability between the bank layer 15 and the lower electrode 14 (and the interlayer insulating film 13) (FIG. 7E). As the printing method, a plate printing method and so forth may be used besides the above-described droplet discharge method.

Figure 7F:
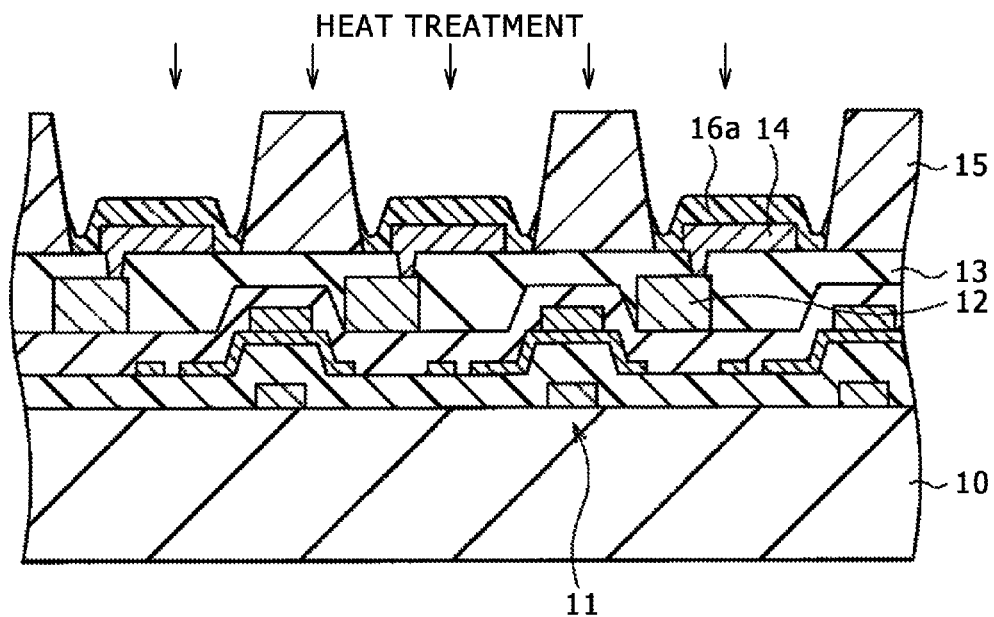

Subsequently, as shown in FIG. 7F, heat treatment (drying treatment) is performed to form the functional layer 16 (in this step, hole injection layer 16a) in the respective apertures 15a. Specifically, the solvent or dispersion medium is dried and then heating at a high temperature is performed. If an electrically-conductive polymer such as polyaniline or polythiophene is used as the hole injection material, an air atmosphere or an oxygen atmosphere is preferable. This is because the electrical conductivity is easily developed due to oxidation of the electrically-conductive polymer by the oxygen. The heating temperature is e.g. 150° C. to 300° C., and the time is e.g. about 5 to 300 minutes although depending on the temperature and the atmosphere.

In this drying step, the vicinity of the interface between layers that are different in the wettability (interface between the bank layer 15 and the interlayer insulating film 13) acts as the origin of film thinning in the drying process and forms part of the above-described thinned part A. In contrast, the film thickness is substantially uniform in the area corresponding to the lower electrode 14 in the deposited hole injection layer 16a (light emitting area).

Thereafter, the hole transport layer 16b and the light emitting layer 16c are deposited through the respective steps of applying, drying, and heat treatment similar to the above-described steps, to thereby form the functional layer 16. In the functional layer 16, these hole transport layer 16b and light emitting layer 16c are sequentially stacked in the track of the shape of the above-described hole injection layer 16a. Therefore, substantially uniform film thickness is obtained in the light emitting area corresponding to the lower electrode 14.

In depositing the hole transport layer 16b, it is preferable that the heat treatment step be performed in an atmosphere composed mainly of nitrogen ($N_2$). Because the existence of oxygen and water possibly lowers the emission efficiency and lifetime of the fabricated organic EL display device, it is preferable that the oxygen concentration be set to e.g. 100 ppm or lower. It is desirable to set the heating temperature to e.g. 100° C. to 230° C. In depositing the light emitting layer 16c, specifically the red light emitting material, the green light emitting material, and the blue light emitting material are each applied to the selected apertures 15a among the plural apertures 15a in the applying step so that the respective color light emitting layers may be disposed at predetermined positions. More specifically, a mixed solution or a dispersion liquid obtained by dissolving polymer material and low-molecular material as the constituent material of the respective color light emitting layers in a solvent prepared by mixing xylene and cyclohexylbenzene at a ratio of 2 to 8 for example is applied onto the hole transport layer 16b.

Figure 7G:
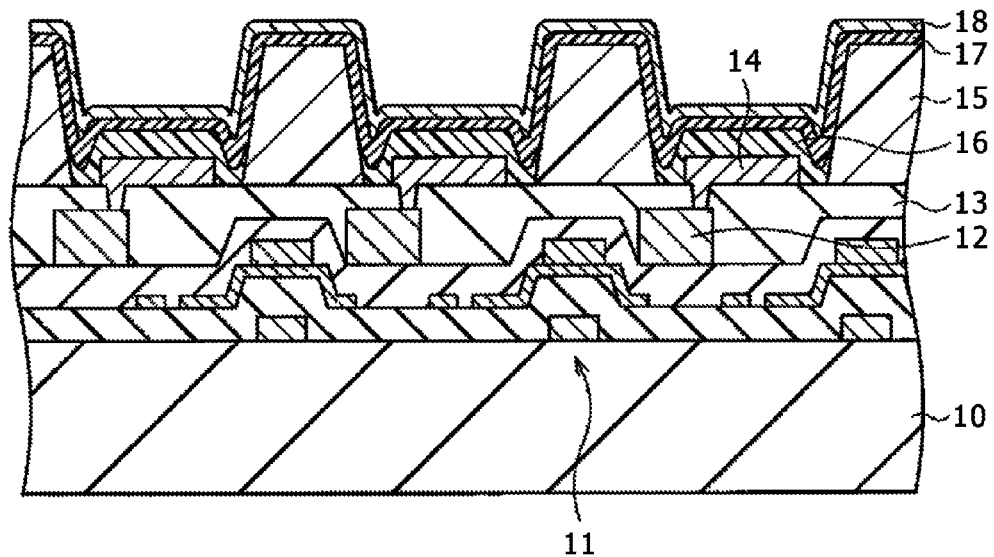

Next, as shown in FIG. 7G, the electron transport layer 17 and the upper electrode 18 composed of the above-described materials are formed in that order over the whole surface of the functional layer 16 by e.g. a vacuum evaporation method. An electron injection layer may be formed between the electron transport layer 17 and the upper electrode 18. These electron transport layer 17 and upper electrode 18 (and electron injection layer, if it is formed) are successively deposited in the same film deposition apparatus without being exposed to the air. This successive film deposition prevents the deterioration of the functional layer 16 due to water in the air.

After the upper electrode 18 is formed, the protective layer 19 is formed by e.g. an evaporation method or a CVD method. Thereafter, for example the sealing substrate 20 is bonded over the protective layer 19 with the intermediary of the adhesion layer (not shown). Through the above-described steps, the organic EL display device 1 shown in FIG. 1 is completed.

[Operation and Effects]

In the organic EL display device 1, the scanning signal is supplied from the scanning line drive circuit 130 to the respective pixels via the gate electrode of the write transistor Tr2 and the image signal from the signal line drive circuit 120 is held in the hold capacitance Cs via the write transistor Tr2. The drive transistor Tr1 is on/off-controlled depending on the signal held in this hold capacitance Cs and a drive current Id is injected to the organic EL elements 10R, 10G, and 10B. Thereby, in the organic EL elements 10R, 10G, and 10B, light emission occurs due to recombination of hole and electron in the light emitting layer 16c. In the case of the lower-surface light emission (bottom emission), the light generated in this manner is extracted after being transmitted through the lower electrode 14 and the drive board 10. In the case of the upper-surface light emission (top emission), the light is extracted after being transmitted through the upper electrode 18, the color filter (not shown), and the sealing substrate 20.

In this organic EL display device 1, in the present embodiment, the pixel areas corresponding to the respective pixels of R, G, and B are defined by the apertures 15a of the bank layer 15. In this aperture 15a, the lower electrode 14 and the functional layer 16 including the light emitting layer 16c are sequentially provided. In such an aperture 15a, the lower electrode 14 is disposed separately from the edge part 15e of the aperture 15a. Operation and effects obtained due to this arrangement of the aperture 15a and the lower electrode 14 will be described below by taking comparative examples (comparative examples 1 and 2).

Comparative Example 1

Figure 8:
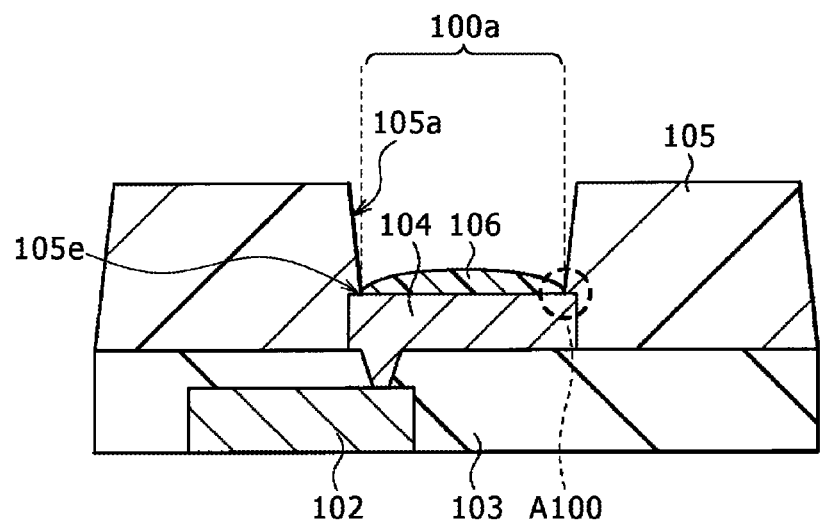
FIG. 8 is a sectional view showing the configuration of the major part in an organic EL element according to comparative example 1.

FIG. 8 shows the arrangement relationship between the aperture of the bank layer and the lower electrode according to comparative example 1. Also in this comparative example 1, similarly to the present embodiment, a lower electrode 104 is disposed on an interlayer insulating film 103 and this lower electrode 104 is electrically connected to a wiring layer 102. A bank layer 105 for pixel isolation is provided on the interlayer insulating film 103 and the lower electrode 104, and the bank layer 105 has an aperture 105a in the area corresponding to the lower electrode 104. Furthermore, a functional layer 106 including a light emitting layer is deposited on the lower electrode 104 in this aperture 105a by a printing method including a step of applying a solution containing a functional layer material and a step of drying a solvent. That is, in comparative example 1, an edge part 105e of the aperture 105a is disposed on the surface (top surface) of the lower electrode 104. Thus, the area corresponding to the part of the lower electrode 104 exposed by the aperture 105a serves as the light emitting area (light emitting area 100a).

However, if the edge part 105e of the aperture 105a is disposed on the lower electrode 104 like this comparative example 1, the following problem occurs in the film deposition process of the functional layer 106 (step of drying the solvent). Specifically, in the drying process, film thinning of the functional layer material occurs in such a manner as to originate from the vicinity of the interface between the bank layer 105 (lyophobic) and the lower electrode 104 (lyophilic). This forms a thinned part A100 near the edge part 105e of the aperture 105a. That is, the thinned part A100 is formed in the light emitting area 100a and unevenness of the film thickness arises in the part of the functional layer 106 contributing to light emission. As a result, electrical short-circuiting between the upper and lower electrodes readily occurs and the displayed-image quality is lowered.

Comparative Example 2

Figure 9:
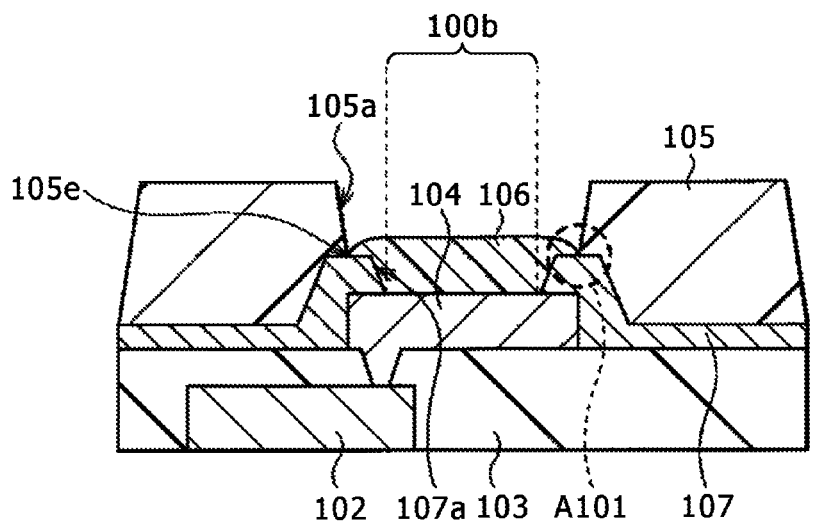
FIG. 9 is a sectional view showing the configuration of the major part in an organic EL element according to comparative example 2.

FIG. 9 shows the arrangement relationship between the aperture of the bank layer and the lower electrode (two-stage bank structure) according to comparative example 2. Also in this comparative example 2, similarly to the present embodiment and comparative example 1, the lower electrode 104 is disposed on the interlayer insulating film 103 and this lower electrode 104 is electrically connected to the wiring layer 102. The bank layer 105 for pixel isolation is provided over the interlayer insulating film 103 and the lower electrode 104, and the bank layer 105 has the aperture 105a in the area corresponding to the lower electrode 104. Furthermore, the functional layer 106 including a light emitting layer is deposited on the lower electrode 104 in this aperture 105a by a printing method including a step of applying a solution containing a functional layer material and a step of drying a solvent. However, in comparative example 2, an inorganic insulating film 107 composed of e.g. $SiO_2$ is provided between the lower electrode 104 and the bank layer 105 differently from comparative example 1. Specifically, the inorganic insulating film 107 having an aperture 107a is provided on the lower electrode 104 and the bank layer 105 is formed on this inorganic insulating film 107. That is, in comparative example 2, the edge part 105e of the bank layer 105 is disposed on the inorganic insulating film 107, and the area corresponding to the part of the lower electrode 104 exposed by the aperture 107a of the inorganic insulating film 107 serves as the light emitting area (light emitting area 100b).

If the inorganic insulating film 107 is provided between the bank layer 105 and the lower electrode 104 like in this comparative example 2, film thinning of the functional layer material occurs in such a manner as to originate from the vicinity of the interface between the bank layer 105 (lyophobic) and the inorganic insulating film 107 (lyophilic) in the drying process. This forms a thinned part A101 near the edge part 105e of the aperture 105a. However, the occurrence of film thickness unevenness of the functional layer 106 is suppressed in the light emitting area 100b. However, in the method of this comparative example 2, after the lower electrode 104 is formed, a step of depositing and patterning the inorganic insulating film 107 is necessary before the bank layer 105 is formed. Thus, the number of steps and the number of parts increase and it is difficult to realize cost reduction.

In contrast, in the present embodiment, in each aperture 15a of the bank layer 15, the lower electrode 14 is provided on the interlayer insulating film 13 in such a manner that part or whole of the lower electrode 14 is separate from the edge part 15e of the aperture 15a as shown in FIG. 5. That is, the interlayer insulating film 13 having lyophilicity is exposed in the area between the bank layer 15 and the lower electrode 14. Due to this feature, in depositing the functional layer 16, film thinning of the functional layer material (hole injection material, in the embodiment) occurs in such a manner as to originate from the vicinity of the interface between the bank layer 15 and the exposed interlayer insulating film 13 (vicinity of the edge part 15e of the aperture 15a). Thus, the thinned part A is readily formed at a position distant from the lower electrode 14 (local thickness change of the functional layer 16 occurs less readily in the substantial light emitting area 10L corresponding to the lower electrode 14). This suppresses the occurrence of electrical short-circuiting between the lower electrode 14 and the upper electrode 18.

As described above, in the present embodiment, the lower electrode 14 is disposed separately from the edge part 15e of the aperture 15a in the bank layer 15. Therefore, the functional layer 16 is formed with substantially uniform film thickness in the light emitting area 10L corresponding to the lower electrode 14 and thus the occurrence of electrical short-circuiting can be suppressed. Furthermore, a layer for preventing short-circuiting (inorganic insulating film 107 of the above-described comparative example 2) is not additionally provided, i.e. it is enough to merely adjust the size of the aperture 15a of the bank layer 15 (merely change the mask used in patterning the bank layer 15). Therefore, the number of steps and the number of parts are not increased. Thus, the displayed-image quality can be enhanced with achievement of cost reduction.

Working Example

About a pixel structure in which the lower electrode 14 was disposed separately from the bank layer 15 as described above, evaluation was made on the substantial aperture ratio and the lifetime. For this evaluation, first the following sample was formed as a working example. Specifically, a glass substrate (25 mm×25 mm) was prepared as the substrate 10a and an $SiO_2$ layer (film thickness 300 nm) as the interlayer insulating film 13 was formed on this substrate 10a. Thereafter, ITO (film thickness 60 nm) was deposited and patterning was performed by a photolithography method to thereby form the lower electrode 14. Thereafter, a polyimide resin material was used as the bank layer 15, and heat treatment (230° C., one hour) was performed after the aperture 15a was formed. Thereafter, the lower electrode 14 was cleaned by oxygen plasma and then lyophobic treatment for the bank layer 15 was performed by plasma treatment by use of a $CF_4$ gas.

ND1501 (product name) made by Nissan Chemical Industries, Ltd. was applied as the hole injection layer 16a on the thus formed bank layer 15 by a nozzle coating method, and baking was performed in the air at 230° C. for 30 minutes. Subsequently, a THF solution prepared by dissolving a hole transport material in xylene, a solvent having a boiling point higher than that of xylene, or a mixed solvent was applied as the hole transport layer 16b by a nozzle coating method. Thereafter, the inside of the applying apparatus was evacuated to a negative pressure state and the solvent was dried in a vacuum, followed by baking at 180° C. for 30 minutes.

Subsequently, the following materials were used as the light emitting layer 16c. Specifically, for the B pixel, a blue light emitting polymer material BPP containing an iridium complex was used. For the G pixel, a green light emitting polymer material GPP was used. For the R pixel, a red light emitting polymer material RPP and a low-molecular material were used. Also for the light emitting layer 16c, the inside of the applying apparatus was evacuated to a negative pressure state and the solvent was dried in a vacuum, followed by baking at 130° C. for 30 minutes. Thereafter, the electron transport layer 17 and the upper electrode 18 were each deposited by vacuum evaporation.

Figure 10:
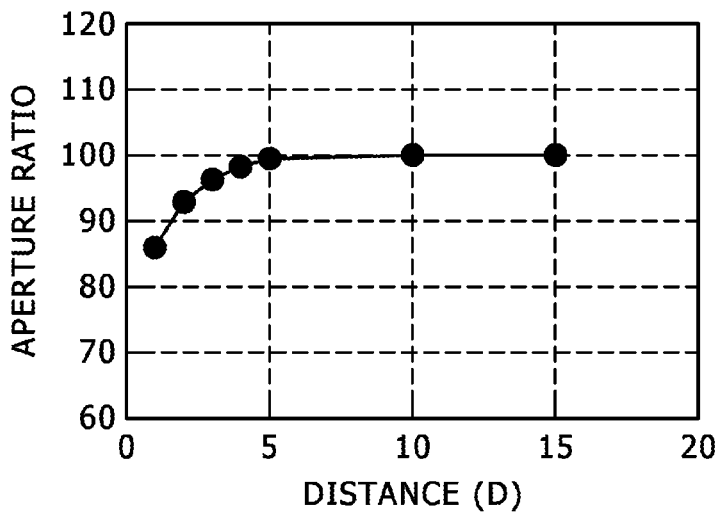
FIG. 10 is a characteristic diagram showing the relationship between the aperture ratio and the distance between the lower electrode and an aperture edge part.
Figure 11:
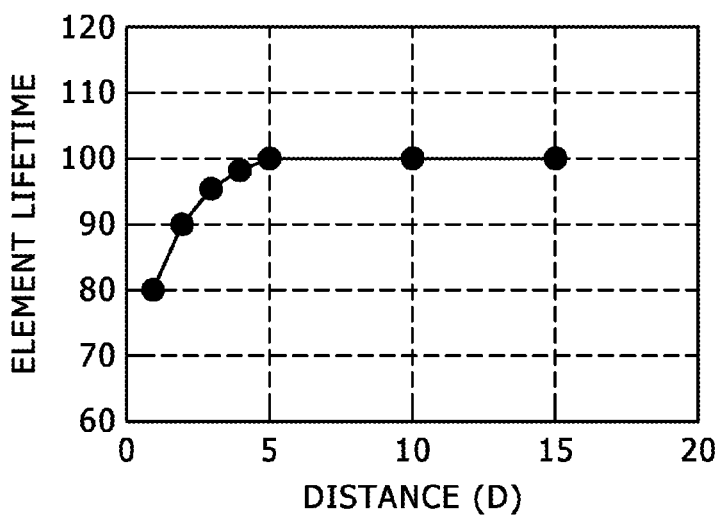
FIG. 11 is a characteristic diagram showing the relationship between the element lifetime and the distance between the lower electrode and the aperture edge part.

In the above-described structure, the distance D between the lower electrode 14 and the edge part 15e of the aperture 15a was changed in a stepwise manner from 1 μm to 15 μm, and the aperture ratio and the element lifetime were measured. These aperture ratio and element lifetime are shown as relative values when the aperture ratio and the element lifetime in the case of employing a two-stage bank structure like that explained in the above-described comparative example 2 are each defined as 100. In the two-stage bank structure (two-stage structure by the inorganic insulating film 107 and the bank layer 105) of comparative example 2, SiO$_2$ having a film thickness of 50 nm was used as the inorganic insulating film 107 and a polyimide resin having a film thickness of 1 μm was used as the bank layer 105. FIG. 10 shows the relationship between the distance D and the aperture ratio measured in this manner. FIG. 11 shows the relationship between the distance D and the element lifetime.

As shown in FIG. 10 and FIG. 11, it turns out that the uniformity of the film thickness of the functional layer 16 is ensured more easily and the aperture ratio and the element lifetime are enhanced as the distance D becomes longer. In particular, it also turns out that effects almost equivalent to those when the two-stage bank structure is formed are achieved if the distance D is equal to or longer than 5 μm. That is, the experiment made it clear that a distance of 5 μm or longer is desirable as the distance D between the lower electrode 14 and the edge part 15e of the aperture 15a.

Modification examples of the above-described embodiment (modification examples 1 and 2) will be described below. The same constituent element as that of the above-described embodiment is given the same numeral and description is accordingly omitted.

Modification Example 1

Figure 12:
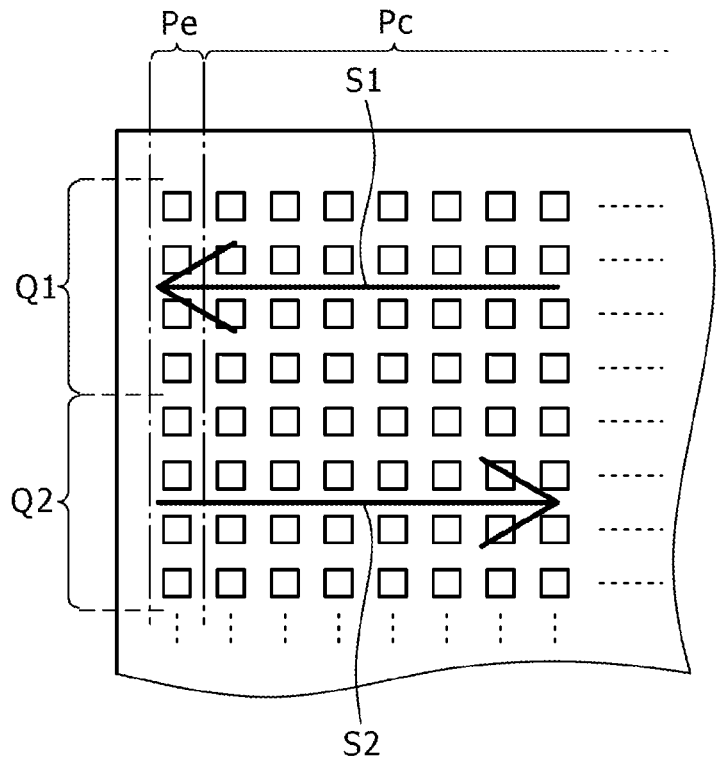
FIG. 12 is a plan view for explaining the arrangement relationship between the lower electrode and the aperture according to modification example 1.

FIGS. 12 to 18B are diagrams for explaining the arrangement relationship between the lower electrode 14 and the aperture 15a of the bank layer 15 according to modification example 1. In the explanation of the above-described embodiment, applying the functional layer material by e.g. a droplet discharge method in depositing the functional layer 16 is described. Specifically, this applying is performed by dropping a predetermined amount of functional layer material from nozzles provided in applying apparatus. Providing the same number of nozzles as the number of pixels (the number of pixel rows) in the applying apparatus causes much size increase of the nozzle head and results in a huge apparatus scale. Therefore, it is desirable to provide a predetermined number of nozzles in the applying apparatus and drop the functional layer material with reciprocation scanning in units of predetermined pixel rows as shown in FIG. 12 to thereby apply the functional layer material onto the whole substrate.

In the case of dropping the functional layer material with reciprocation scanning in this manner, difference arises in the film thickness of the functional layer 16 after drying between pixels Pe located at the end part of the bank layer 15 (specifically, end part as a turning point of the reciprocation scanning) and the other pixels Pc (e.g. pixels located at the center part). Thus, in the present modification example, the distance D between the lower electrode 14 and the edge part 15e of the aperture 15a is so set as to differ depending on the pixel position.

Figure 13:
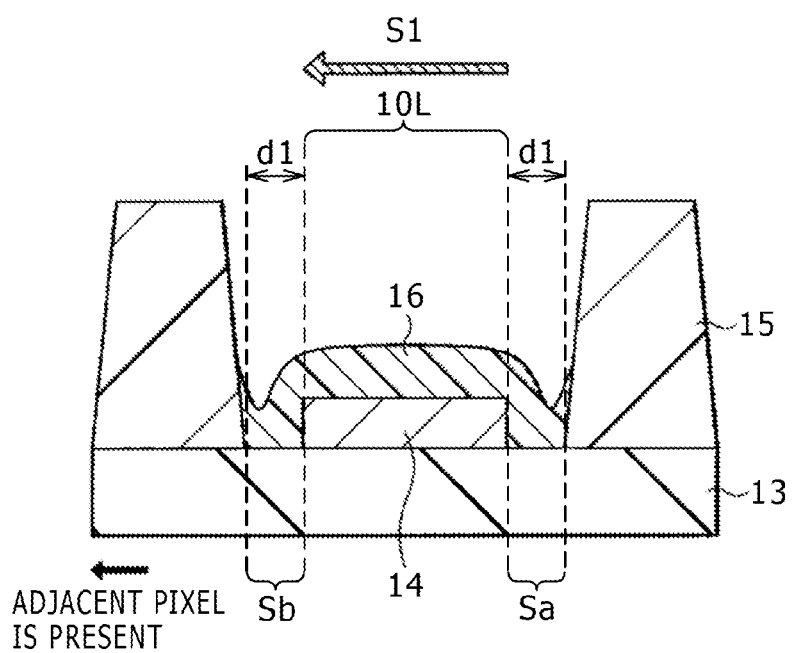
FIG. 13 is a sectional view for explaining the arrangement relationship between the lower electrode and the aperture according to modification example 1.

Specifically, as shown in FIG. 13, in the pixel Pc at the center part, both of the widths (distances D) of areas Sa and Sb on both sides of the lower electrode 14 are d1 in the direction along the traveling direction of a scanning direction S1. This is because of the following reason. Specifically, in the pixel located at part other than the end part like the center part, the adjacent pixel exists along the scanning direction S1. Thus, the amount of dropping is equivalent between both sides of the lower electrode 14 and the film thickness of the functional layer 16 after applying and drying becomes substantially uniform.

Figure 14A:
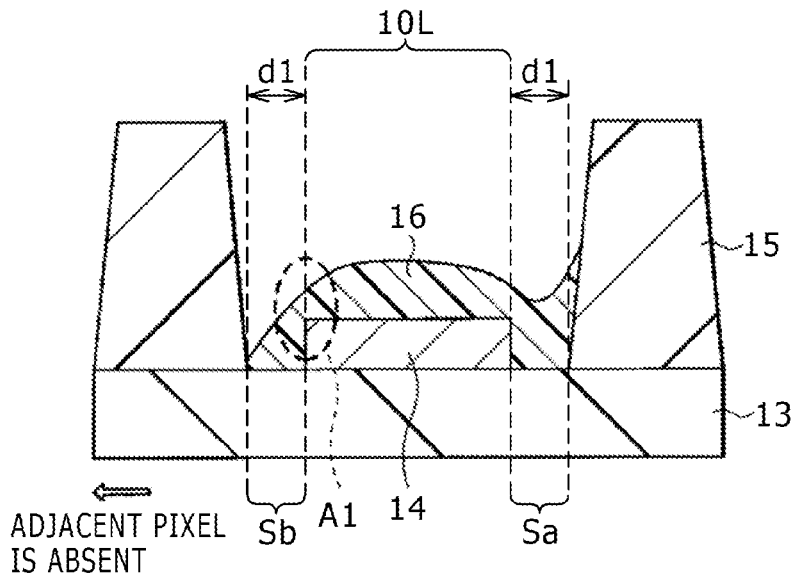
FIGS. 14A and 14B are sectional views for explaining the arrangement relationship between the lower electrode and the aperture according to modification example 1.
Figure 14B:
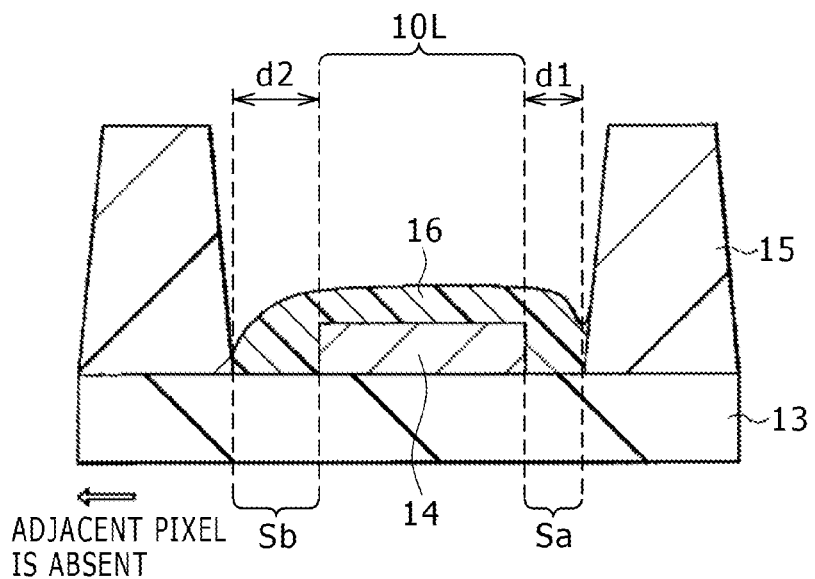

In contrast, in the pixel Pe at the end part, the adjacent pixel does not exist along the traveling direction of the scanning direction S1. Therefore, if both of the distances D of the areas Sa and Sb are set equivalent to that in the pixel Pc (=d1), a thinned part A1 is so formed as to overlap with the light emitting area 10L on the end part side of the functional layer 16, and film thickness unevenness referred to as so-called swath unevenness occurs (FIG. 14A). This is because the dropped part of the functional layer material and the non-dropped part exist in a mixed manner at the end part as a turning point of the reciprocation scanning. Therefore, in such an end-part pixel Pe, the distance D of the area Sb on the end part side (=d2) is set longer than the distance D in the other pixels (=d1).

For locally changing the distance D, it is preferable to adjust the aperture area of the aperture 15a in the bank layer 15 without changing the size of the lower electrode 14.

The distance D may be changed depending on the pixel position like in the present modification example. For example, the distance D can be set relatively long in the pixel located at the scanning end, whereas the distance D can be set relatively short in the pixel located at the center part. Due to this feature, advantageous effects equivalent to those of the above-described embodiment are achieved. In addition, swath unevenness is suppressed and favorable displayed-image quality can be realized in the whole display area.

Modification Example 2

Figure 15:
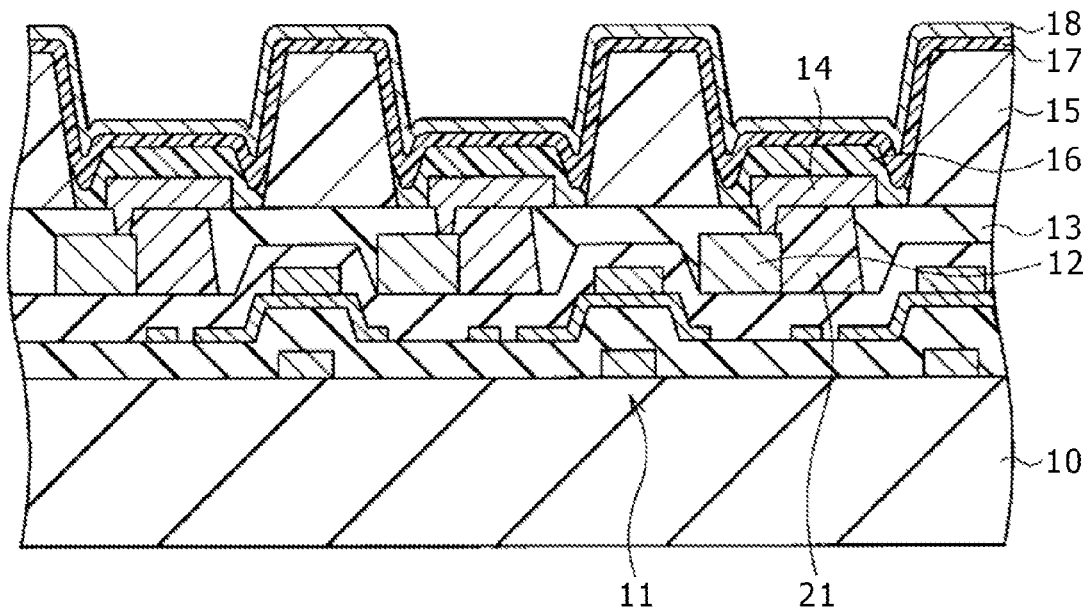
FIG. 15 is a diagram showing the sectional configuration of an organic EL display device according to modification example 2.

FIG. 15 shows the sectional configuration of an organic EL display device according to modification example 2. In the present modification example, similarly to the above-described embodiment, the bank layer 15 having the plural apertures 15a exists over the drive board 10 and the lower electrode 14 is disposed in each aperture 15a separately from the edge part 15e of the aperture 15a. The functional layer 16 including the light emitting layer 16c is deposited on the lower electrode 14 by a printing method and the electron transport layer 17 and the upper electrode 18 are provided over the functional layer 16. The protective film 19 and the sealing substrate 20 exist over this upper electrode 18 although not shown in the diagram.

In the present modification example, an organic planarizing film 21 is provided in the drive board 10 together with the interlayer insulating film 13 in such a manner as to cover the TFTs 11 and the wiring layer 12. In the case of using such an organic planarizing film 21, the organic planarizing film 21 is disposed only under the lower electrode 14. Alternatively, it may be disposed under the bank layer 15. However, the interlayer insulating film 13 is exposed in the area opposed to the edge part 15*e* of the aperture 15*a* of the bank layer 15.

The organic planarizing film 21 may be provided in a predetermined area of the drive board 10 like in the present modification example. Also in such a configuration, the thinned part of the functional layer 16 can be formed outside the light emitting area and advantageous effects as those of the above-described embodiment can be achieved as long as the interlayer insulating film 13 composed of an inorganic material is formed opposed to at least the edge part 15*e* of the aperture 15*a* of the bank layer 15.

APPLICATION EXAMPLES

Application examples of the organic EL display device explained in the above-described embodiment and modification examples will be described below. The organic EL display device of the above-described embodiment and so forth can be applied to electronic apparatus in every field, such as television devices, digital cameras, notebook personal computers, portable terminal devices typified by cellular phones, and video camcorders. In other words, the organic EL display device of the above-described embodiment and so forth can be applied to electronic apparatus in every field that displays a video signal input from the external or a video signal generated inside as image or video.

Module

Figure 16:
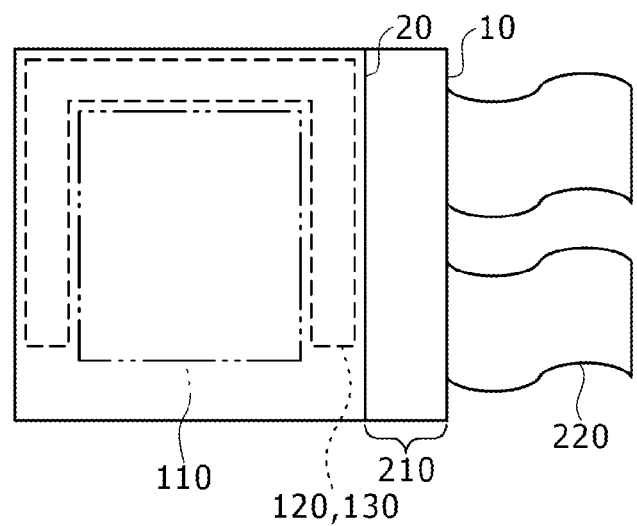
FIG. 16 is a plan view showing the schematic configuration of a module including the display device of the above-described embodiment and so forth.

The organic EL display device of the above-described embodiment and so forth is incorporated into various pieces of electronic apparatus such as application examples 1 to 5 to be described later as a module shown in FIG. 16 for example. This module is obtained e.g. by setting an area 210 exposed from the sealing substrate 20 along one side of the drive board 10 and forming an external connection terminal (not shown) in this exposed area 210 by extending the wiring of the signal line drive circuit 120 and the scanning line drive circuit 130. The external connection terminal is provided with a flexible printed circuit (FPC) 220 for signal input/output.

Application Example 1

Figure 17:
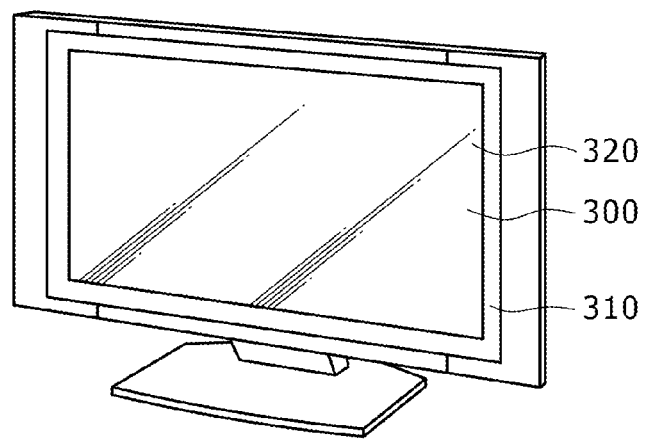
FIG. 17 is a perspective view showing the appearance of application example 1 of the display device of the above-described embodiment and so forth.

FIG. 17 shows the appearance of a television device according to application example 1. This television device has e.g. a video display screen section 300 including a front panel 310 and a filter glass 320, and this video display screen section 300 is configured by the organic EL display device according to the above-described embodiment and so forth.

Application Example 2

Figure 18A:
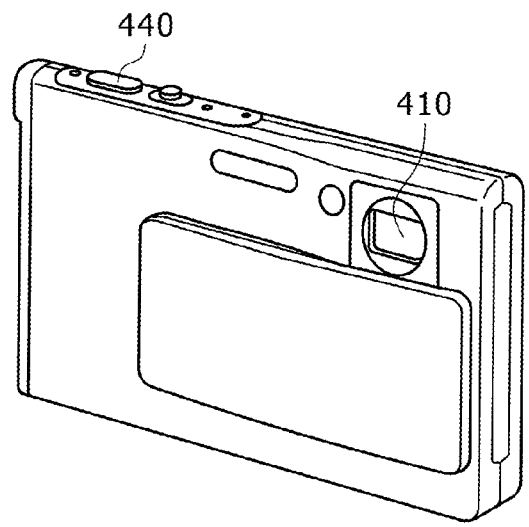
FIG. 18A is a perspective view showing the appearance of the front side of application example 2 and FIG. 18B is a perspective view showing the appearance of the back side.
Figure 18B:
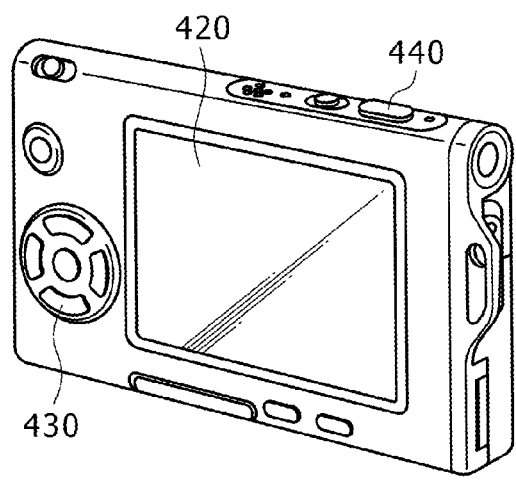

FIGS. 18A and 18B show the appearance of a digital camera according to application example 2. This digital camera has e.g. a light emitter 410 for flash, a display section 420, a menu switch 430, and a shutter button 440, and the display section 420 is configured by the organic EL display device according to the above-described embodiment and so forth.

Application Example 3

Figure 19:
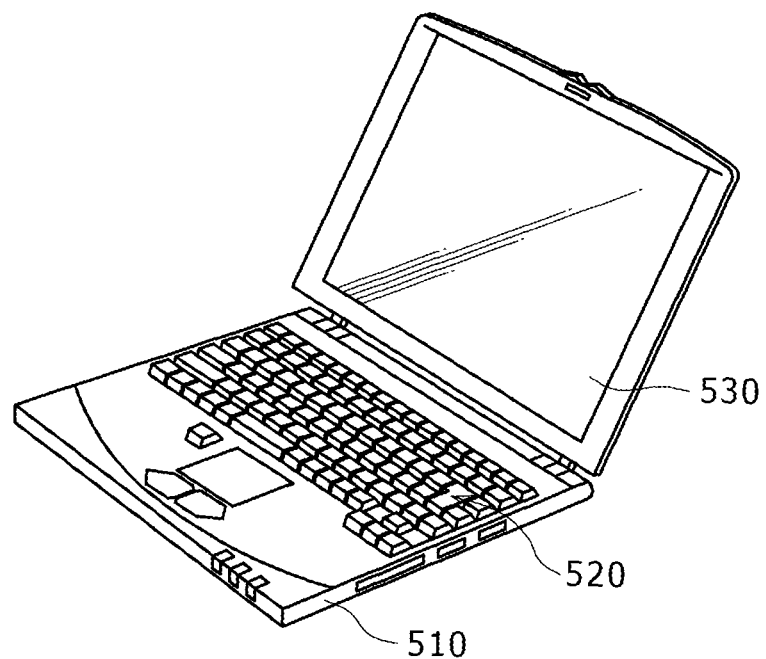
FIG. 19 is a perspective view showing the appearance of application example 3.

FIG. 19 shows the appearance of a notebook personal computer according to application example 3. This notebook personal computer has e.g. a main body 510, a keyboard 520 for input operation of characters and so forth, and a display section 530 that displays images, and the display section 530 is configured by the organic EL display device according to the above-described embodiment and so forth.

Application Example 4

Figure 20:
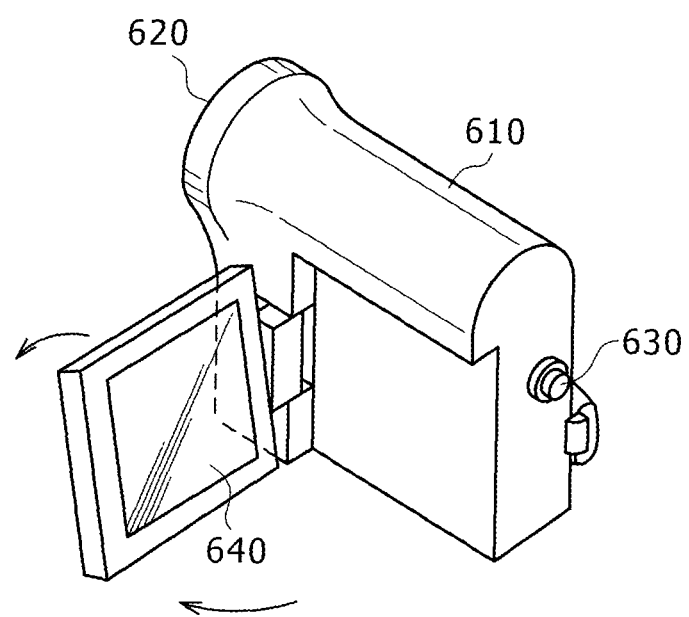
FIG. 20 is a perspective view showing the appearance of application example 4.

FIG. 20 shows the appearance of a video camcorder according to application example 4. This video camcorder has e.g. a main body section 610, a lens 620 that is provided on the front side of this main body section 610 and is used for subject photographing, a start/stop switch 630 about photographing, and a display section 640, and the display section 640 is configured by the organic EL display device according to the above-described embodiment and so forth.

Application Example 5

FIGS. 21A to 21G shows the appearance of a cellular phone according to application example 5. This cellular phone is made by coupling an upper chassis 710 with a lower chassis 720 by a coupling part (hinge part) 730 and has a display 740, a sub-display 750, a picture light 760, and a camera 770. The display 740 or the sub-display 750 is configured by the organic EL display device according to the above-described embodiment and so forth.

Although embodiment, modification examples, and application examples of the present disclosure are described above, the present disclosure is not limited to the embodiment and so forth and various modifications are possible. For example, the materials, thicknesses, film deposition methods, film deposition conditions, and so forth of the respective layers explained in the above-described embodiment and so forth are not limited. Other materials, thicknesses, film deposition methods, and film deposition conditions may be employed.

The above-described embodiment and so forth are explained by taking as an example the case in which the whole lower electrode 14 (all of four end parts corresponding to all sides of the rectangular shape) is disposed separately from the edge part 15*e* of the aperture 15*a* of the bank layer 15. However, the whole part does not necessarily need to be separated. For example, part of the lower electrode 14 may be in contact with the bank layer 15. For example, the lower electrode 14 is electrically connected to the wiring layer 12, which is provided under the lower electrode 14 and includes the drain electrode and so forth. This connection part may be formed in contact with the bank layer 15. Alternatively, because such a connection part is so formed as to fill the contact hole formed in the interlayer insulating film, normally the electrode material sinks down in the area corresponding to this connection part and a hollow is generated in the lower electrode surface. The bank layer may be so provided as to overlap with such a hollow part.

Furthermore, the above-described embodiment and so forth are explained by specifically describing the configuration of the organic EL elements 10R, 10G, and 10B. However, these elements do not necessarily need to include all layers and may further include another layer. Moreover, in the above-described embodiment and so forth, a display device including red and green organic EL elements as organic EL elements other than blue organic EL elements is explained. However, an embodiment of the present disclosure is not limited thereto and can be applied to the overall display devices in which a functional layer can be formed by using a printing method. For example, an embodiment of the present disclosure can be applied also to a display device including blue organic EL elements and yellow organic EL elements.

In addition, in the above-described embodiment and so forth, an active-matrix display device is explained. However, an embodiment of the present disclosure can be applied also to a passive-matrix display device. Furthermore, the configuration of the pixel drive circuit for active-matrix driving is not limited to that explained in the above-described embodiment and capacitive element and transistor may be added according to need. In this case, corresponding to the change in the pixel drive circuit, a desired drive circuit may be added besides the above-described signal line drive circuit 120 and scanning line drive circuit 130.

Furthermore, in the above-described embodiment and so forth, the case in which the organic EL display device is a top emission type or a bottom emission type is explained. However, an embodiment of the present disclosure can be applied also to an organic EL display device of such a type that light is extracted from both upper surface and lower surface.

The present disclosure contains subject matter related to that disclosed in Japanese Priority Patent Application JP 2011-053989 filed in the Japan Patent Office on Mar. 11, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An organic electroluminescence display device comprising:
    a pixel isolating film configured to be provided over a substrate and have a plurality of apertures; and
    a plurality of pixels configured to be provided corresponding to the plurality of apertures, wherein
    each of the plurality of pixels has a first electrode, a functional layer including at least an organic light emitting layer, and a second electrode sequentially from a side of the substrate, and
    part or whole of the first electrode is separate from an edge part of the aperture on the side of the substrates;
    wherein a separation distance between the first electrode and the edge part differs depending on position of the aperture in the pixel isolating film.

2. The organic electroluminescence display device according to claim 1, wherein
    the pixel isolating film has lyophobicity, and
    the first electrode and the pixel isolating film are provided over the substrate with intermediary of a lyophilic film.

3. The organic electroluminescence display device according to claim 2, wherein
    a transistor section that drives the pixels and an interlayer insulating film covering the transistor section exist over the substrate, and
    the interlayer insulating film serves also as the lyophilic film.

4. The organic electroluminescence display device according to claim 3, wherein
    an organic planarizing film is provided in a selective area under the first electrode.

5. The organic electroluminescence display device according to claim 2, wherein
    the lyophilic film contains at least one kind of a silicon oxide, a silicon nitride, a titanium oxide, and a titanium nitride.

6. The organic electroluminescence display device according to claim 2, wherein
    the pixel isolating film is composed of any of a polyimide resin, an acrylic resin, and a novolac resin.

7. The organic electroluminescence display device according to claim 2, wherein
    the functional layer is composed of a polymer material.

8. The organic electroluminescence display device according to claim 2, wherein
    the first electrode is provided inside the edge part of the aperture on the lyophilic film.

9. The organic electroluminescence display device according to claim 1, wherein
    the first electrode is provided separately from the edge part of the aperture by at least 5 µm.

10. The organic electroluminescence display device according to claim 1, wherein
    the functional layer has a locally thinned part in an area between the edge part of the aperture and the first electrode.

11. Electronic apparatus including an organic electroluminescence display device comprising:
    a pixel isolating film configured to be provided over a substrate and have a plurality of apertures; and
    a plurality of pixels configured to be provided corresponding to the plurality of apertures, wherein
    each of the plurality of pixels has a first electrode, a functional layer including at least an organic light emitting layer, and a second electrode sequentially from a side of the substrate, and
    part or whole of the first electrode is separate from an edge part of the aperture on the side of the substrate;
    wherein a separation distance between the first electrode and the edge part differs depending on position of the aperture in the pixel isolating film.

* * * * *